US009960571B2

(12) United States Patent
Meyer et al.

(10) Patent No.: US 9,960,571 B2
(45) Date of Patent: May 1, 2018

(54) WEAKLY INDEX-GUIDED INTERBAND CASCADE LASERS WITH NO GROWN TOP CLADDING LAYER OR A THIN TOP CLADDING LAYER

(71) Applicant: The United States of America, as represented by the Secretary of the Navy, Washington, DC (US)

(72) Inventors: Jerry R. Meyer, Catonsville, MD (US); Igor Vurgaftman, Severna Park, MD (US); Chadwick Lawrence Canedy, Washington, DC (US); William W. Bewley, Falls Church, VA (US); Chul Soo Kim, Springfield, VA (US); Charles D. Merritt, Fairfax, VA (US); Michael V. Warren, Arlington, VA (US); Mijin Kim, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/631,040

(22) Filed: Jun. 23, 2017

(65) Prior Publication Data
US 2017/0373472 A1 Dec. 28, 2017

Related U.S. Application Data

(60) Provisional application No. 62/411,704, filed on Oct. 24, 2016, provisional application No. 62/354,133, filed on Jun. 24, 2016.

(51) Int. Cl.
*H01S 5/34* (2006.01)
*H01S 5/30* (2006.01)
(Continued)

(52) U.S. Cl.
CPC ........ *H01S 5/3401* (2013.01); *H01S 5/0224* (2013.01); *H01S 5/02236* (2013.01);
(Continued)

(58) Field of Classification Search
CPC .... H01S 5/3401; H01S 5/3402; H01S 5/0421; H01S 5/22; H01S 5/2063
See application file for complete search history.

(56) References Cited

U.S. PATENT DOCUMENTS 5,588,015 A 12/1996 Yang et al.
5,793,787 A 8/1998 Meyer et al.
(Continued)

OTHER PUBLICATIONS

Search Report and Written Opinion dated Aug. 30, 2017 in corresponding application PCT/US2017/038915.
(Continued)

*Primary Examiner* — Michael Carter
(74) *Attorney, Agent, or Firm* — US Naval Research Laboratory; Joslyn Barritt

(57) ABSTRACT

Novel ICL layering designs, ridge waveguide architectures, and processing protocols that will significantly lower the optical losses and improve the power conversion efficiencies of interband cascade lasers designed for both DFB single-mode and high-power applications. The semiconductor top cladding and metal contact layers are eliminated or significantly reduced. By instead using a dielectric or air top clad, or dielectric or air layers to supplement a thin top clad, in conjunction with lateral current injection and weak index-guiding, the present invention will substantially reduce the internal loss of such ICLs, resulting in lower lasing threshold, higher efficiency, and higher maximum power.

28 Claims, 13 Drawing Sheets

(51) Int. Cl.
  *H01S 5/22* (2006.01)
  *H01S 5/12* (2006.01)
  *H01S 5/042* (2006.01)
  *H01S 5/022* (2006.01)
  *H01S 5/20* (2006.01)

(52) U.S. Cl.
  CPC .............. *H01S 5/0421* (2013.01); *H01S 5/12* (2013.01); *H01S 5/2063* (2013.01); *H01S 5/22* (2013.01); *H01S 5/2206* (2013.01); *H01S 5/305* (2013.01); *H01S 5/3402* (2013.01)

(56) References Cited

U.S. PATENT DOCUMENTS

| | | | |
|---|---|---|---|
| 5,799,026 | A | 8/1998 | Meyer et al. |
| 8,125,706 | B2 | 2/2012 | Vurgaftman et al. |
| 8,290,011 | B2 | 10/2012 | Vurgaftman et al. |
| 8,385,378 | B2 | 2/2013 | Vurgaftman et al. |
| 8,493,654 | B2 | 7/2013 | Vurgaftman et al. |
| 8,798,111 | B2 | 8/2014 | Vurgaftman et al. |
| 8,879,593 | B2 | 11/2014 | Kim et al. |
| 9,059,570 | B1 | 6/2015 | Vurgaftman et al. |
| 2007/0008999 | A1 | 1/2007 | Breznay et al. |
| 2012/0300804 | A1 | 11/2012 | Bauer et al. |
| 2014/0247851 | A1* | 9/2014 | Hashimoto ............ B82Y 20/00 372/45.012 |
| 2015/0188290 | A1 | 7/2015 | Vurgaftman et al. |
| 2016/0049770 | A1 | 2/2016 | Frez et al. |
| 2016/0156156 | A1 | 6/2016 | Yang et al. |
| 2016/0359298 | A1 | 12/2016 | Meyer et al. |

OTHER PUBLICATIONS http://nanoplus.com/en/products/distributed feedback lasers/distributed feedback lasers 3000 nm 6000 nm/.

M. Kim, W. W. Bewley, C. L. Canedy, C. S. Kim, C. D. Merrill, J. Abell, I. Vurgaftman, and J. R. Meyer, "High Power Continuous Wave Interband Cascade Lasers with 10 Active Stages," Opt. Expr. 23, 9664 (2015).

D. S. Kim, M. Kim, J. Abell, W. W. Bewley, C. D. Merrill, C. L. Canedy, I. Vurgaftman, and J. R. Meyer, "Mid infrared distributed feedback interband cascade lasers with continuous wave single mode emission to 80° C.," Appl. Phys. Lett. 101, 061104 (2012).

Igor Vurgaftman, William W. Bewley, Chadwick L. Canedy, Chul Soo Kim, Mijin Kim, Charles D. Merrill, Joshua Abell, and Jerry R. Meyer, "Interband Cascade Lasers With Low Threshold Powers and High Output Powers," IEEE J. Sel. Topics Quant. Electron. 19, 1200120 (2013).

Michael von Edlinger, Julian Scheuermann, Robert Weih, Christian Zimmermann, Lars Nahle, Marc Fischer, Johannes Koeth, Sven Höfling, and Martin Kamp, "Monomode Interband Cascade Lasers at 5.2 μm for Nitric Oxide Sensing," IEEE Phot. Tech. Lett. 26, 480 (2014).

S. Forouhar, C. Borgentun, C. Frez, R. M. Briggs, M. Bagheri, C. L. Canedy, C. S. Kim, M. Kim, W. W. Bewley, C. D. Merritt, J. Abell, Vurgaftman, and J. R. Meyer, "Reliable mid infrared laterally coupled distributed feedback interband cascade lasers," Appl. Phys. Lett. 105, 051110 (2014).

C. S. Kim, M. Kim, W. W. Bewley, J. R. Lindle, C. L. Canedy, J. A. Nolde, D. C. Larrabee, I. Vurgaftman, and J. R. Meyer, "Broad Stripe, Single Mode, Mid IR Interband Cascade Laser with Photonic Crystal Distributed Feedback Grating," Appl. Phys. Lett. 92, 071110 (2008).

M. Kim, C. S. Kim, W. W. Bewley, C. D. Merrill, C. L. Canedy, J. Abell, I. Vurgaftman, and J. R. Meyer, "Interband Cascade Lasers with High CW Power and Brightness," Proc. SPIE 9370, 9370029 (2015).

C. S. Kim, M. Kim, J. R. Lindle, W. W. Bewley, C. L. Canedy, J. Abell, I. Vurgaftman, and J. R. Meyer, "Corrugated Sidewall Interband Cascade Lasers with Single Mode Midwave Infrared Emission at Room Temperature," Appl. Phys. Lett. 95, 231103 (2009).

L. Li, Y. Jiang, H. Ye, R. Q. Yang, T. D. Mishima, M. B. Santos, and M. B. Johnson, "Low-threshold InAs-based interband cascade lasers operating at high temperatures," Appl. Phys. Lett. 106, 251102 (2015).

I. Vurgaftman, R. Weih, M. Kamp, J. R. Meyer, C. L. Canedy, C. S. Kim, M. Kim, W. W. Bewley, C. D. Merritt, J. Abell, and S. Höfling, "Interband Cascade Lasers," J. Phys. D 48, 123001 (2015).

W. W. Bewley, C. S. Kim, M. Kim, I. Vurgaftman, C. L. Canedy, J. R. Lindle, J. Abell, and J. R. Meyer, "High-Performance Interband Cascade Lasers for λ=3-4.5 μm," International Journal of High Speed Electronics and Systems vol. 21, No. 1 (2012) 1250014.

* cited by examiner

WEAKLY INDEX-GUIDED INTERBAND CASCADE LASERS WITH NO GROWN TOP CLADDING LAYER OR A THIN TOP CLADDING LAYER

CROSS-REFERENCE

This Application is a Nonprovisional of and claims the benefit of priority under 35 U.S.C. § 119 based on Provisional U.S. Patent Application No. 62/354,133 filed on Jun. 24, 2016, and Provisional U.S. Patent Application No. 62/411,704 filed on Oct. 24, 2016. The abovementioned Provisional Applications and all references cited herein are hereby incorporated by reference into the present disclosure in their entirety.

TECHNICAL FIELD

The present invention relates to modifications to the design and processing of interband cascade lasers (ICLs).

BACKGROUND

The interband cascade laser is a promising semiconductor coherent source for the midwave infrared (mid-IR, defined here as 2.5-7 µm) spectral region, with extension to longer wavelengths a possibility if the internal loss that increases with increasing wavelength can be suppressed.

The ICL differs from the mid-IR quantum cascade laser (QCL) by employing interband rather than intersubband active transitions. The carrier lifetime associated with interband transitions is three orders of magnitude longer than for intersubband transitions, which ultimately results in more than an order-of-magnitude lower drive power in the ICL.

The basic concept of the ICL was proposed by Rui Yang in 1994, while he was at the University of Toronto, and patented shortly later while he was at the University of Houston. See U.S. Pat. No. 5,588,085, "Light Emitting Devices Based On Interband Transitions In Type-II Quantum Well Heterostructures" (1998). Subsequently, critical improvements to the basic ICL structure, such as including more than one hole well to form a hole injector, were made in a joint patent by two of the present NRL inventors and Dr. Yang. See U.S. Pat. No. 5,799,026, "Interband Quantum Well Cascade Laser, With A Blocking Quantum Well For Improved Quantum Efficiency" (1998).

This was followed by a number of other patents by some of the present NRL inventors, which introduced numerous further improvements. See, e.g., U.S. Pat. No. 5,793,787, "Type II Quantum Well Laser with Enhanced Optical Matrix" (1998); U.S. Pat. No. 5,799,026, "Interband Quantum Well Cascade Laser with a Blocking Quantum Well for Improved Quantum Efficiency" (1998); U.S. Pat. No. 8,125,706, "High Temperature Interband Cascade Lasers" (2012); U.S. Pat. No. 8,290,011, "Interband Cascade Lasers" (2012); U.S. Pat. No. 8,385,378, "Interband Cascade Lasers" (2013); and U.S. Pat. No. 8,493,654, "High Temperature Interband Cascade Lasers" (2013). One of the most critical of those improvements was to substantially increase the doping density in the electron injector, so as to increase the ratio of electron and hole densities in the active QWs and thereby lower the lasing threshold current density ("carrier rebalancing"). This dramatically reduced the threshold power for ICL operation, to as low as 29 mW at room temperature. See U.S. Pat. No. 8,798,111, "Interband Cascade Lasers with Engineered Carrier Densities" (2014); and U.S. Pat. No. 9,059,570, "Interband Cascade Lasers with Engineered Carrier Densities" (2015).

ICLs have multiple active gain stages that are separated by electron and hole injectors. Most commonly, the active optical transitions that produce gain are spatially indirect (type-II), in which the electron and hole wavefunctions peak in adjacent electron (e.g., InAs) and hole (e.g., GaInSb) QWs, although they may also be spatially direct (type-I), in which the electrons and hole wavefunctions peak in the same layer (e.g., InGaAsSb). See U.S. Pat. No. 5,799,026 and U.S. Pat. No. 9,059,570, supra.

Most of the laser ridge waveguide and contacting architectures applied so far to ICLs have followed general principles known to the semiconductor laser community. To provide optical confinement, most ICLs employ moderately n-doped InAs/AlSb superlattice cladding layers on top and bottom of the active gain stages. Most designs also insert top and bottom separate confinement layers (SCLs), consisting of lightly n-doped GaSb, between the active gain region and the top and bottom cladding layers. The typical ICL layering design, which usually includes a bottom GaSb substrate and buffer layer, bottom cladding layer, bottom SCL, three to fifteen active gain stages, top SCL, top optical cladding layer, and heavily-doped cap for electrical contacting, plus thin transition superlattices inserted between the various regions to assist electrical transport from one region to the next, is fully described, for example, in I. Vurgaftman, R. Weih, M. Kamp, J. R. Meyer, C. L. Canedy, C. S. Kim, M. Kim, W. W. Bewley, C. D. Merritt, J. Abell, and S. Höling, "Interband Cascade Lasers," *J. Phys. D* 48, 123001 (2015).

The primary role of the $n^-$-GaSb top and bottom SCLs is to place a substantial fraction of the lasing mode in a region with lower loss than either the active gain stages or the optical cladding layers. Nonetheless, free carrier absorption in the cladding layers contribute to the net internal loss, since those layers must be doped heavily enough to provide adequate electrical transport for current injection. Furthermore, as discussed below, the loss can increase substantially when the lasing mode must strongly couple to a distributed feedback (DFB) grating that is etched into the top of the ridge waveguide or into a dielectric layer that is deposited on top of the ridge waveguide.

Distributed feedback (DFB) interband cascade lasers that emit in a single spectral mode are attractive mid-IR sources for use in chemical sensing and other applications. DFB ICLs spanning the wavelength range between 3 and 6 µm have recently become available as commercial products. See http://nanoplus.com/en/products/distributed-feedback-lasers/distributed-feedback-lasers-3000-nm-6000-nm/. However, none of the DFB ICLs reported to date have displayed power conversion efficiencies approaching those of non-DFB ICLs. See, e.g., M. Kim, W. W. Bewley, C. L. Canedy, C. S. Kim, C. D. Merritt, J. Abell, I. Vurgaftman, and J. R. Meyer, "High-Power Continuous-Wave Interband Cascade Lasers with 10 Active Stages," *Opt. Expr.* 23, 9664 (2015).

The most straightforward geometry for realizing a semiconductor distributed-feedback (DFB) laser emitting in a narrow spectral line is to etch a grating into the top surface of a structure with reduced top optical cladding thickness that allows penetration of the optical mode into the grating region. See, e.g., C. S. Kim, M. Kim, J. Abell, W. W. Bewley, C. D. Merritt, C. L. Canedy, I. Vurgaftman, and J. R. Meyer, "Mid-infrared distributed-feedback interband cascade lasers with continuous-wave single-mode emission to 80° C.," *Appl. Phys. Lett.* 101, 061104 (2012).

Some semiconductor material systems used for DFB lasers then allow the overgrowth of an electrically-conducting semiconductor with lower refractive index than the active core to complete the top optical cladding layer and also provide a low-loss pathway for injecting electrical current into the semiconductor. However, no suitable overgrowth capability is currently available for interband cascade lasers (ICLs) grown on GaSb or InAs substrates. Therefore, for ICLs the top of the grating itself must be metallized to provide the top electrical contact. The coupling coefficient varies exponentially with the top cladding thickness. For example, for an ICL emitting at $\lambda \approx 3.5$ µm, the top cladding thickness must be reduced to at most $\approx 500$ nm if optical coupling to the grating is to be sufficient to suppress non-resonant longitudinal modes and assure the production of a narrow linewidth.

Thus, a primary disadvantage of this geometry is that without an overgrown spacer layer, the lasing mode penetrates into the metal contact, introducing additional optical loss that also varies exponentially with the cladding thickness. While the magnitude of the extra loss depends on the contact metallization scheme, a typical value for ICLs with conventional Ti/Pt/Au contacts is at least 2-3 cm$^{-1}$. Since this is comparable to the internal losses originating from all other sources combined, the mode overlap with the lossy metal inevitably degrades the slope and wallplug efficiencies. Furthermore, this loss may increase substantially at wavelengths longer than 4 µm.

While alternative DFB geometries such as side gratings which sometimes employ a double mesa are possible, those approaches have other disadvantages related to coupling strength to the grating, processing/performance yield, and/or maximum single-mode output power and efficiency. See Igor Vurgaftman, William W. Bewley, Chadwick L. Canedy, Chul Soo Kim, Mijin Kim, Charles D. Merritt, Joshua Abell, and Jerry R. Meyer, "Interband Cascade Lasers With Low Threshold Powers and High Output Powers," *IEEE J. Sel. Topics Quant. Electron.* 19, 1200120 (2013); and Michael von Edlinger, Julian Scheuermann, Robert Weih, Christian Zimmermann, Lars Nähle, Marc Fischer, Johannes Koeth, Sven Höfling, and Martin Kamp, "Monomode Interband Cascade Lasers at 5.2 µm for Nitric Oxide Sensing," *IEEE Phot. Tech. Lett.* 26, 480 (2014) (side gratings); see also S. Forouhar, C. Borgentun, C. Frez, R. M. Briggs, M. Bagheri, C. L. Canedy, C. S. Kim, M. Kim, W. W. Bewley, C. D. Merritt, J. Abell, Vurgaftman, and J. R. Meyer, "Reliable mid-infrared laterally-coupled distributed-feedback interband cascade lasers," *Appl. Phys. Lett.* 105, 051110 (2014) (double mesa).

However, a significant issue in general for DFB ICLs is that the grating coupling strength tends to be marginal at best, because the evanescent coupling to a side grating is inherently weaker, and because the stronger coupling possible with a top grating is inevitably accompanied by a higher optical loss associated with mode penetration into the contact metal deposited directly on top of the grating. Marginal coupling to the DFB grating leads to degradation of the yield and tuning range for lasers emitting in a single spectral mode. The issue is amplified further when a higher-order grating is desired to relax the requirement for high spatial resolution in the processing, for example, to allow optical rather than e-beam lithography to be employed.

For non-DFB designs, it is usually preferred that the optical cladding layers be thick enough to fully confine the lasing mode so as to minimize the optical losses associated with evanescent penetration of the mode into the top contact metallization as well as losses resulting from leakage of the mode into the GaSb substrate whose refractive index is higher than that of the active gain stages.

However, when a DFB grating is present, the top cladding layer must be thin enough to provide substantial overlap between the lasing mode and the grating. As noted above, in conventional DFB ICL designs that call for deposition of the top contact metal directly on top of the grating, this inevitably increases the internal loss because the lasing mode evanescently penetrates into the lossy metal contact.

A recent patent application filed by some of the present inventors disclosed a method for mitigating the high loss associated with penetration of the lasing mode into the contact metal, namely by depositing the metal contact only on some fraction of the top of the ridge (reduced contact fill factor) rather than the entire top surface, and then relying on the strong current spreading characteristic of ICLs to provide current injection into the lateral regions not covered by the metal. See U.S. Patent Application Publication No. 2016/0359298, "Interband Cascade Lasers with Low-Fill-Factor Top Contact for Reduced Loss." Preliminary reductions to practice confirmed that the method effectively lowered the lasing thresholds and increased the slope efficiencies of ICL test devices.

However, that approach cannot reduce the loss to zero because some fraction of the mode still overlaps the contact metal. There is also a limit to the minimum thickness of the top optical cladding layer, since even with a reduced contact fill factor the loss induced by mode overlap with the remaining contact areas becomes excessive if the top cladding layer is too thin. That places an upper bound on the maximum coupling coefficient between the lasing mode and the DFB grating. It would be preferable to eliminate the mode overlap with the top contact metal altogether, so that a much stronger grating could be provided without the usual penalty of high optical loss.

While ion bombardment has proven to be a useful tool for suppressing both optical gain and electrical conduction in diode lasers emitting at wavelengths, no previous works have described the effective application of this approach to interband cascade lasers. ICLs present special challenges differing from those of other semiconductor lasers, especially concerning the difficulty of suppressing the lateral injection of current into regions that are not intended to provide gain. Previous experiments at NRL confirmed that ion bombardment can fully suppress lasing and photoluminescence in interband cascade laser structures. See C. S. Kim, M. Kim, W. W. Bewley, J. R. Lindle, C. L. Canedy, J. A. Nolde, D. C. Larrabee, I. Vurgaftman, and J. R. Meyer, "Broad-Stripe, Single-Mode, Mid-IR Interband Cascade Laser with Photonic-Crystal Distributed-Feedback Grating," *Appl. Phys. Lett.* 92, 071110 (2008). However, NRL attempts to significantly reduce the lateral electrical conduction in ICLs were unsuccessful. We are not aware of any prior experiments investigating the effects of ion bombardment on interband cascade laser properties.

Another issue that often affects the ICL processing yield is current leakage at the sidewalls of a narrow ridge, resulting from damage imposed by the reactive ion etching process that defines the ridge. NRL has employed both $CH_4/C_{12}$- and $BCl_3$-based inductively coupled plasma reactive ion etch processes. See M. Kim, C. S. Kim, W. W. Bewley, C. D. Merritt, C. L. Canedy, J. Abell, I. Vurgaftman, and J. R. Meyer, "Interband Cascade Lasers with High CW Power and Brightness," *Proc. SPIE* 9370, 9370029 (2015). While the $CH_4/Cl_2$-based etch has generally been somewhat more reliable, even with that process the yield associated with reactive ion etching remains a significant issue. The invention will substantially mitigate this yield issue.

A further consideration well known to the art is that for a fixed ridge width, a narrow ridge waveguide semiconductor laser tends to operate more reliably and stably in the fundamental lateral mode if it is "weakly index-guided", that is, the mode is confined to an inner ridge that is defined by a relatively weak lateral spatial variation of the refractive index rather than by gain guiding or by a more abrupt lateral variation. An abrupt lateral variation of the refractive index is obtained, for example, when the ridge width is defined by a single deep etch to below the active quantum wells. The ridge sidewalls are then typically coated with a dielectric that has much lower refractive index than the semiconductor epilayer. It is known that a more preferable variation of the modal refractive index is obtained when a shallow etch is employed to form an inner ridge to laterally confine the lasing mode. Weak index guiding is readily applicable to most types of semiconductor lasers, since lateral current spreading is minimal and current injected into the inner ridge remains confined mostly to the inner ridge.

However, it is known (see, e.g., Forouhar et al., supra) that lateral current spreading tends to be quite extensive in an ICL, because of the very large electrical anisotropy of the short-period InAs—AlSb superlattice that forms the upper cladding layer. While a double ridge geometry was applied to DFB ICLs by Forouhar et al., the threshold current was excessive compared to most ICLs due to lateral spreading into the outer ridge that does not contribute to gain. For this reason, nearly all other previous narrow-ridge ICLs have employed a single ridge defined by a deep etch to below the active gain stages. As mentioned above, this induces strong index guiding that degrades the mode properties associated with a ridge of given width.

The present invention provides a means for realizing weakly index-guided ICL ridges in which current does not parasitically spread appreciably into the outer ridge.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides novel ICL layering designs, ridge waveguide architectures, and processing protocols that will significantly lower the optical losses and improve the power conversion efficiencies of interband cascade lasers that are weakly confined to an inner ridge and may be used for both DFB single-mode and high-power applications. The key feature of the present invention is the elimination or significant reduction of the semiconductor top cladding layers present in conventional, ICLs, while still providing electrical contact without incurring additional optical loss. By eliminating these layers, and instead using a dielectric or air top clad, or dielectric or air layers to supplement a thin top clad, in conjunction with lateral current injection, the present invention will substantially reduce the internal loss of such ICLs, resulting in lower lasing threshold, higher efficiency, and higher maximum power.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides novel ICL layering designs, ridge waveguide architectures, and processing protocols that will significantly lower the optical losses and improve the power conversion efficiencies of interband cascade lasers designed for both DFB single-mode and high-power applications. The key feature of the present invention is the elimination or significant reduction of the semiconductor top cladding and metal contact layers present in conventional ICLs. By eliminating these layers, and instead using a dielectric or air top clad, or dielectric or air layers to supplement a thin top clad, in conjunction with lateral current injection into a weakly index-guided inner ridge, the present invention will substantially reduce the internal loss of such ICLs, resulting in lower lasing threshold, higher efficiency, and higher maximum power.

In addition, removal of all or most of the top cladding layer will also maximize coupling between the lasing mode and a top distributed feedback grating in DFB ICLs. The invention will therefore be beneficial in applications where single-mode output or low drive power is important, for example, in chemical sensing systems driven by battery power or which require that the system footprint be minimized for portability.

The invention will also minimize the internal loss and maximize the power conversion efficiency in applications requiring high output power.

Recent experiments by the inventors of the present invention at the Naval Research Laboratory (NRL) investigated the effects of bombardment with hydrogen ions on the pulsed electrical and optical properties of a series of five 7-stage broad area (150 µm×2 mm) ICLs processed from the same wafer, with thick grown top cladding layers and uncoated facets. In these experiments, the hydrogen ion energy was fixed at 340 keV, while the dose level was varied from 0 to $6 \times 10^{13}$ cm⁻².

Figure 1A:
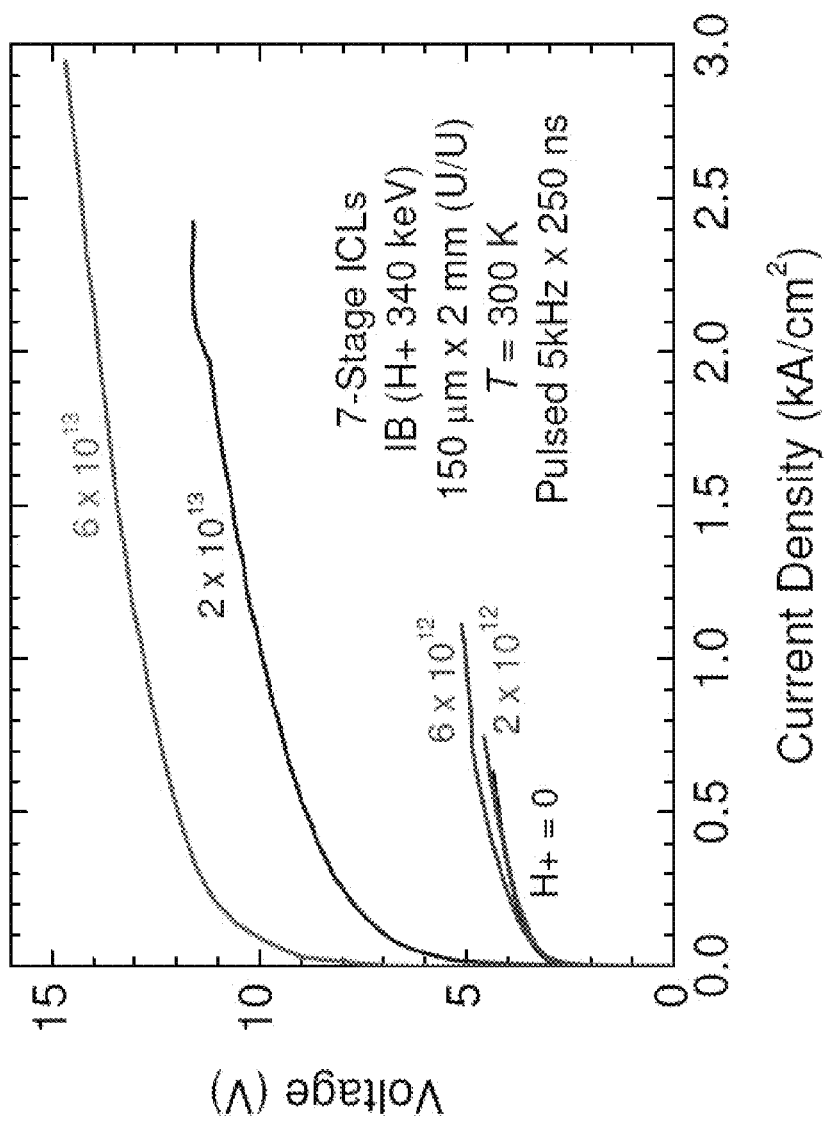
FIGS. 1A and 1B are plots illustrating variations in the pulsed current-voltage (I-V) and light-current (L-I) characteristics, respectively, for a series of five 7-stage broad area (150 µm×2 mm) ICLs processed from the same wafer, operating in pulsed mode at a temperature of 300 K×cm⁻
Figure 1B:
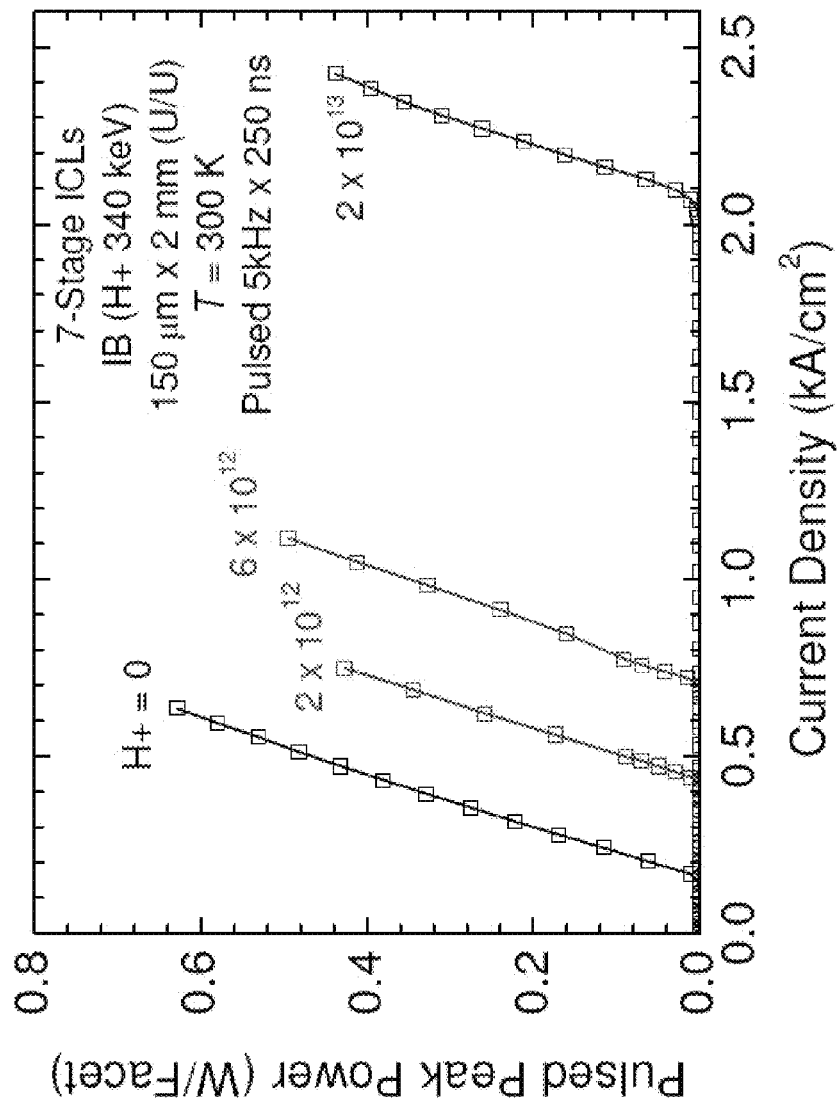

FIGS. 1A and 1B are plots illustrating how the pulsed current-voltage (I-V) and light-current (L-I) characteristics, respectively, when the five lasers were operated in pulsed mode at a temperature of 300 K. The inventors found that whereas dose levels up to $6\times10^{12}$ cm$^{-2}$ had relatively little effect on the pulsed I-V characteristics, the voltage required to produce any significant current flow increased substantially at the higher bombardment doses. In particular, these results showed that if one region of an ICL epilayer with thick top cladding layer is bombarded at a high dose level (e.g., $6\times10^{13}$ cm$^{-2}$) while another region is not bombarded, the application of a typical ICL operating bias of ≈4 V (for 7 stages), will induce a substantial flow of current through the active gain stages of the non-bombarded region, whereas virtually no current will flow vertically through the bombarded portion of the device. This confirms that ion bombardment at a sufficient dose provides an effective means for partially or significantly restricting the vertical flow of current through the optical cladding layers and active gain stages of an ICL epilayer. Other NRL experiments imply that current flow in the lateral direction is relatively unimpeded if the thin heavily-doped n$^+$-InAs top contact layer of a conventional ICL structure with a thick top cladding layer remains in place, although current flow appears to be suppressed if that layer is removed and the current must flow laterally through the underlying n-InAs—AlSb superlattice of the top optical cladding layer.

In addition, it is well known that the electrical conductivity in an interband cascade laser is highly anisotropic. The light-current (L-I) characteristics shown in FIG. 1B indicate that the current density required to reach the lasing threshold increases considerably with increasing bombardment dose, most likely due to a decrease of the Shockley-Read lifetime caused by bombardment-induced defects. The device bombarded with the highest ion dose of $6\times10^{13}$ cm$^{-2}$ did not lase at all at 300 K at any available injection current.

Embodiments of ICLs having no grown top cladding layer or a thin grown top cladding layer in accordance with the present invention will now be described in the context of the FIGURES which are filed herewith and which form a part of the present disclosure. In the discussion below, like numbers are used to refer to like elements in the FIGURES, with the first digit of the reference numbers being changed to reflect the FIGURE in which they are shown. For example, an n$^-$-GaSb top separate confinement layer (SCL) is referred to as SCL layer 206 in the description with respect to FIGS. 2A-2D, SCL layer 306 in the description with respect to FIGS. 3A-3C, SCL layer 406 in the description with respect to FIGS. 4A-4B, etc. In addition, it should be noted that the dimensions shown in the FIGURES are given merely by way of example and are not in any way intended to be limiting of the embodiments illustrated therein.

The block schematics in FIGS. 2A-2D illustrate aspects of an exemplary epitaxial layering design for an ICL that incorporates one or more aspects of the present invention.

Figure 2A:
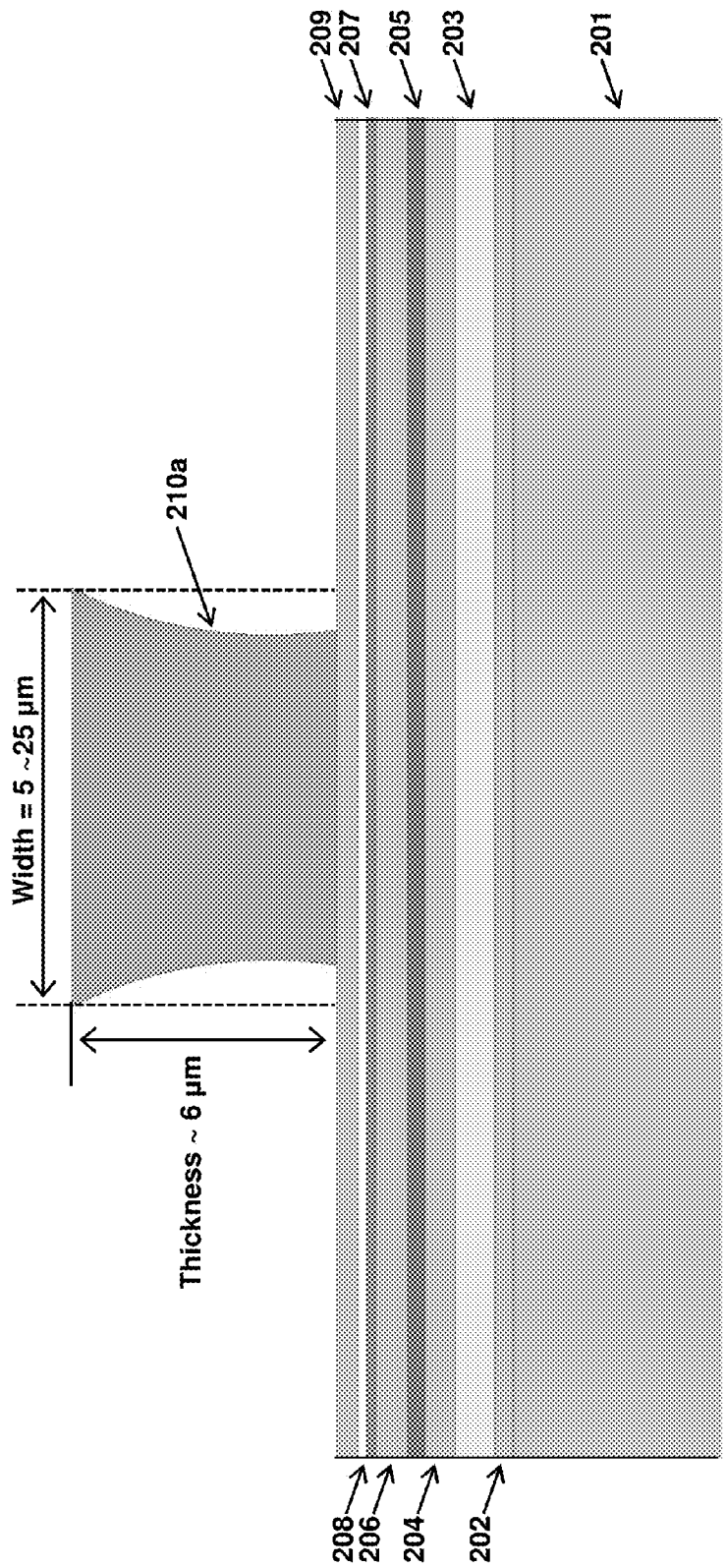
FIGS. 2A-2D are block schematics illustrating aspects of an exemplary epitaxial layering design and successive narrow ridge processing steps for an ICL having no grown top cladding layer in accordance with the present invention.

As illustrated in FIG. 2A, the structure, which may be grown by molecular beam epitaxy (MBE) or by any other suitable method, includes a GaSb substrate 201; a GaSb buffer layer 202; an InAs/AlSb superlattice bottom optical cladding layer 203 having a lower refractive index than that of the active core; an optional n$^-$-GaSb bottom separate confinement layer (SCL) 204 having a refractive index higher than that of the active core; an active core 205 comprising three (3) to fifteen (15) interband cascade gain stages, each including an active quantum well (QW) region, a hole injector, and an electron injector; and an optional n$^-$-GaSb top SCL 206 having a refractive index higher than that of the active core. The components of the active gain region act in combination to produce electron and hole energy levels and wavefunctions which, when combined under appropriate bias and electrical injection, cause the emission of light from the medium. Details regarding the structure of the active core of an ICL and an exemplary embodiment thereof can be found in U.S. Pat. No. 8,385,378, supra, though many variations of the active core described therein may also be employed as appropriate.

These layers are nominally similar to those in a conventional ICL design, although for some embodiments of the invention it may be advantageous to adjust the layer thicknesses somewhat to redistribute the optical mode as will be discussed below. The ICL structure may also be grown on an InAs substrate, as described by L. Li, Y. Jiang, H. Ye, R. Q. Yang, T. D. Mishima, M. B. Santos, and M. B. Johnson, "Low-threshold InAs-based interband cascade lasers operating at high temperatures," *Appl. Phys. Lett.* 106, 251102 (2015), In such cases, the GaSb buffer and SCL layers of the description above will be replaced by InAs buffer and SCL layers, and other analogous substitutions will be obvious to one skilled in the art.

The exemplary structure illustrated in FIG. 2A differs from a conventional ICL in that no top optical cladding layer is grown above the top SCL. Instead, the structure terminates with a thin (50-200 nm) heavily n-doped (e.g., mid-$10^{17}$ to mid-$10^{18}$ cm$^{-3}$ in exemplary embodiments) top contact layer 207 such as n$^+$-GaSb or n$^+$-InAs(Sb); an optional undoped AlAs$_{0.08}$Sb$_{0.92}$ (lattice matched to GaSb) etch-stop layer 208; and finally an n$^-$-GaSb index-guiding layer 209 having a refractive index higher than that of the active core. Alternatively, in some embodiments, a thin top cladding layer (not shown) such as a InAs—AlSb superlattice having a thickness of 50-500 nm and a refractive index less than that of the active core may be grown in between top SCL layer 206 and top contact layer 207, and in such embodiments, this grown thin top cladding layer may serve as part of the top cladding layer for the ICL.

For example, an exemplary 5-stage ICL emitting at λ≈3.6 μm and designed in accordance with the invention can include a top SCL layer 206 formed from about 50 nm of moderately n-doped (≈$10^{17}$ cm$^{-3}$) GaSb followed by 280 nm of lightly n-doped (≈$5\times10^{15}$ cm$^{-3}$) GaSb; an n$^+$-InAs(Sb) or n$^+$-GaSb top contact layer 207 having a thickness of 20 nm and doping ≈$10^{18}$ cm$^{-3}$; an optional undoped AlAs$_{0.08}$Sb$_{0.92}$ etch-stop layer 208 having a thickness of 20 nm; and an n$^-$-GaSb index-guiding layer 209 having a thickness of 200 nm and doping ≈$5\times10^{15}$ cm$^{-3}$. In some embodiments, the heavily n-doped GaSb top contact layer 207 can be replaced by an InAs/AlSb transition superlattice of any design suitable for transitioning with low electrical resistance to an n$^+$-InAs$_{0.91}$Sb$_{0.09}$ (lattice-matched to GaSb) top contact layer. The n$^+$-InAs(Sb) top contact 207 is then again followed by the same optional AlAs$_{0.08}$Sb$_{0.92}$ etch-stop layer 208 and n$^-$-GaSb top index-guiding layer 209. For ICLs emitting at wavelengths other than λ≈3.6 μm, the design may be modified by those skilled in the art according to principles known to the art, with the thicknesses of the top n$^-$-GaSb SCL and top n$^-$-GaSb waveguide layer scaling linearly with wavelength.

It will be obvious to one skilled in the art that the invention may also be applied to many other variations on the exemplary layering designs illustrated in the figures. For example, other materials besides an InAs/AlSb superlattice may be employed for the lower and optional thin upper optical cladding layers, other materials besides GaSb and InAs may be employed for the bottom and top SCLs, other materials besides $n^+$-InAs(Sb) and $n^+$-GaSb may be used for the thin heavily n-doped top contact layer, other materials besides $AlAs_{0.08}Sb_{0.92}$ may be employed for the etch-stop layer, and other materials besides GaSb may be employed for the top index-guiding layer. Additional layers such as transition superlattices may also be inserted between the layers that are explicitly specified.

If it is intended that the processed lasers will be distributed feedback (DFB) ICLs that emit in a single spectral mode, in some embodiments, the next step of the processing after the ICL structure is grown involves patterning DFB gratings with one or more pitches on the top surface of the otherwise unprocessed chip. The gratings may be patterned by e-beam or optical lithography, and then are etched into the top GaSb layer using any suitable method known to the art. The etch depth is optimized in conjunction with other design considerations related to the waveguide and mode distribution to provide robust single-mode emission and other favorable lasing characteristics, as guided by principles known to the art. In some embodiments, the optimal etch depth will be a substantial fraction of the thickness of the top GaSb layer.

As described in more detail below, in some embodiments, a low-loss and low-index dielectric (not shown) such as SiN is next deposited on top of the wafer material that may contain an etched DFB grating. Since this dielectric will serve as a top optical cladding layer, its thickness should be great enough to prevent significant penetration of the lasing mode into the metal layer that will subsequently be deposited on top to provide a pathway for heat dissipation. If SiN is used for the dielectric, this thickness is roughly 500 nm. In other embodiments described below, the top surface is left bare so that air serves as the top cladding layer, and no metal will be deposited on top of the ridge.

In either case, a first thick layer of photoresist 210a is deposited onto the ICL material layer stack, usually on top of $n^-$-GaSb guiding layer 209, and is patterned to cover a portion of the stack, often referred to as a "photoresist stripe" having a width roughly equal to that of the weakly index-guided inner ridge 212 that will subsequently be patterned as described below. In the exemplary embodiment illustrated in the FIGURES, the photoresist has a thickness of about 6 μm and covers a photoresist stripe having a width of about 5-25 μm; however, as will be readily appreciated, the width of photoresist 210a can vary depending on the desired width of the index-guided ridge waveguide laser, and its thickness can vary depending on its effectiveness in shielding the stripe against ion bombardment.

Figure 2B:
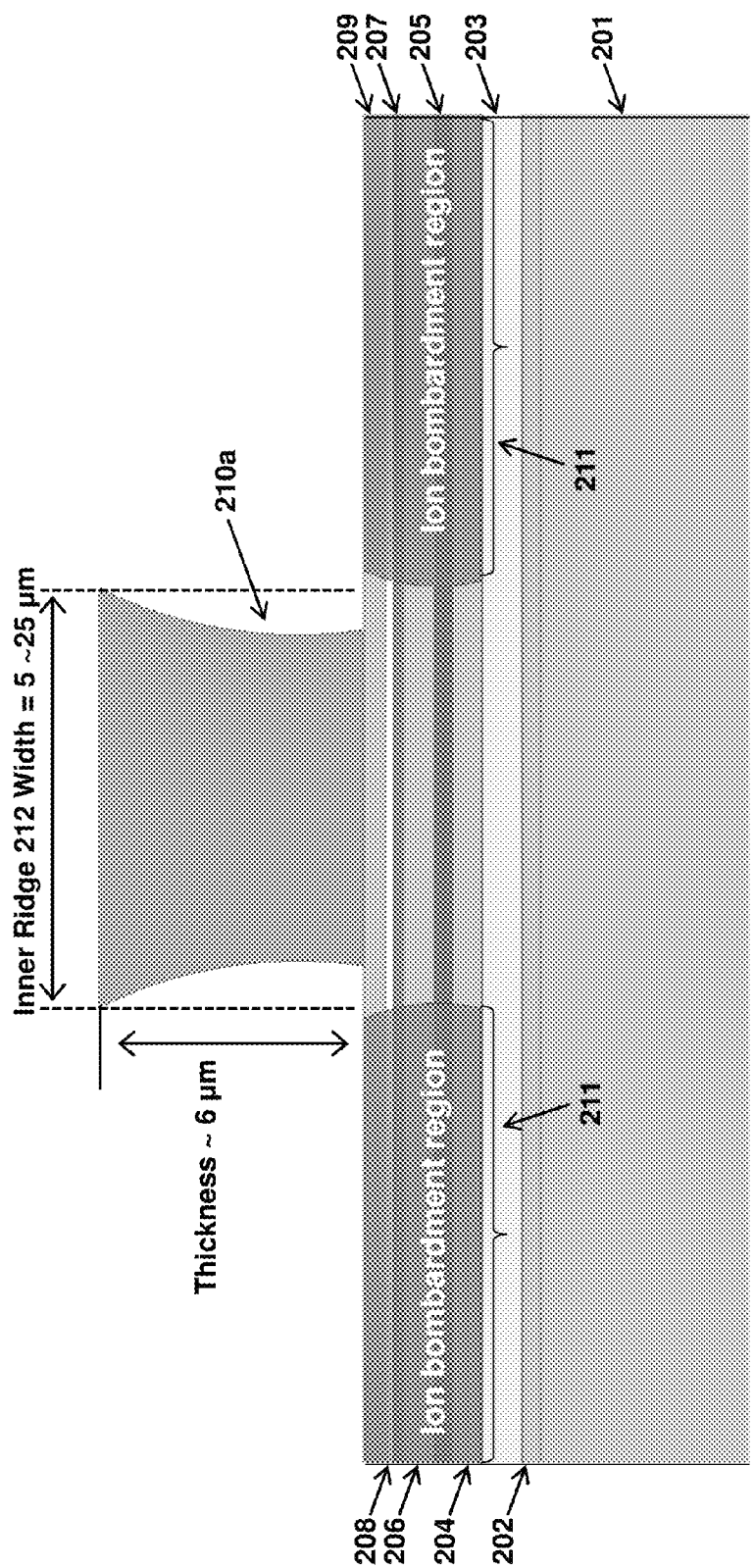

Next, the exposed areas of the structure not covered by the photoresist are ion bombarded. The bombardment is at a dose and bombardment energy sufficient not only to suppress gain within the active gain stages of the ICL but also to suppress the flow of electrical conduction along the vertical and possibly the lateral axis in the bombarded regions. This may require that a series of bombardment doses and bombardment energies be employed to assure that current suppression of optical loss enhancement are provided throughout the thickness of the structure. The regions of the epitaxial structure whose optical and electrical properties are thus altered by the ion bombardment are shown in FIG. 2B as the darker areas labeled "ion bombardment regions 211," while the lighter area under the photoresist is protected from the bombardment and thus remains unaffected. The results shown by the plots in FIG. 1A indicate that bombardment with hydrogen ions having energy 340 keV and dose level of $6 \times 10^{13}$ cm$^{-2}$ may provide a higher lasing threshold and a strong suppression of current flow along the vertical axis, although other ion species, bombardment energies, and bombardment doses may also be suitable. As will be discussed below, ion bombardment under these or other conditions will also at least partly suppresses lateral current flow in some types of ICL structures.

Figure 2C:
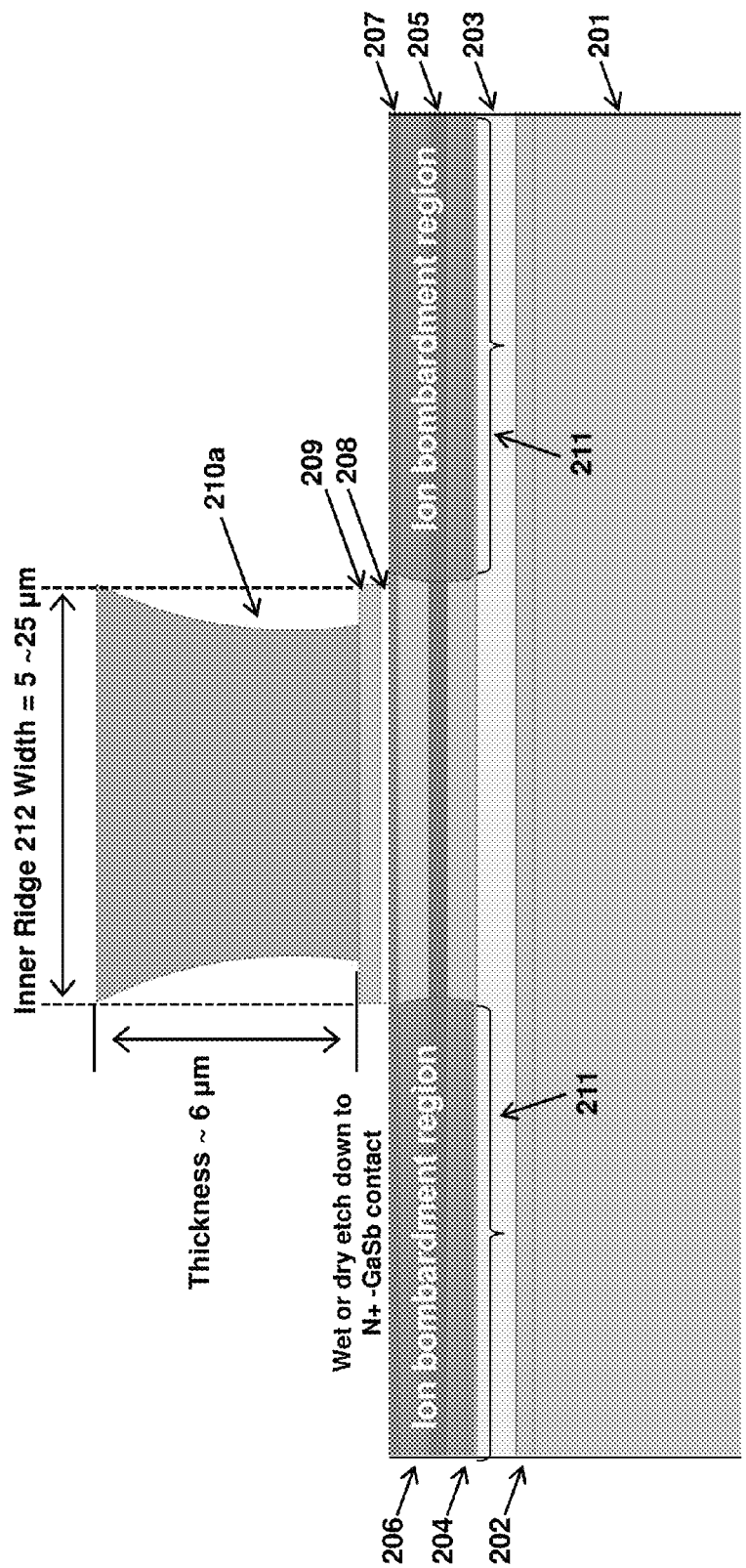

With thick photoresist layer 210a still in place, in a next step, aspects of which are illustrated in FIG. 2C, the weakly index-guided inner ridge waveguide is defined. In some embodiments, the ridge width is adjusted to the maximum width for which lasing occurs in a single lateral mode. In other embodiments, the ridge width is adjusted so as to maximize the brightness of the output beam even though lasing may not occur in a single lateral mode. In still other embodiments, the ridge width is adjusted so as to minimize the drive power required to reach the lasing threshold.

The inner ridge waveguide can be defined by means of wet or dry etching. The etch should be of good optical quality, though leakage currents associated with sidewall damage are not an issue because the etch of the inner ridge begins and ends above the active gain stages.

Thus, in some embodiments, the inner ridge waveguide can be defined by means of wet etching with phosphoric acid based etchant down to the $AlAs_{0.08}Sb_{0.92}$ etch-stop layer 208. An additional wet etch with hydrochloric acid based etchant may then be used to remove the remainder of the $AlAs_{0.08}Sb_{0.92}$ layer in the etched region to expose the heavily n-doped GaSb or InAs(Sb) contact layer. Alternatively, in other embodiments, reactive ion etching can be used to etch down to heavily n-doped contact layer 207; in such embodiments, the sacrificial $AlAs_{0.08}Sb_{0.92}$ layer 208 may be omitted from the growth if another means is available for assuring that the etch stops at the top of or within the heavily n-doped contact layer.

In either case, the thicknesses of the top SCL and index-guiding layers should be designed in conjunction with the stage multiplicity of active core 205, as well as the structure of bottom SCL 204 and bottom optical cladding layers 203 to provide robust lateral confinement of the lasing mode within the weakly index-guided inner ridge, along with a vertical mode distribution that provides an optimal relation between gain and loss. In addition, the heavily n-doped contact layer 207 should be thick enough to ensure that the etch stops within this layer to allow for good electrical contact, but not so thick that excessive optical loss is induced.

Thick photoresist layer 210a that was used to define the regions for ion bombardment and etching of the weakly index-guided inner ridge waveguide is then removed. If the laser is to be a DFB device and the DFB grating was not patterned as the first step of the processing as discussed above, in some embodiments the grating may be patterned by e-beam or optical lithography at this stage. In such cases, the grating width may extend beyond the top surface of the inner index-guided ridge, in order to provide additional evanescent coupling to the fraction of the lasing mode penetrating beyond the index-guided boundaries of inner ridge 212.

It will be obvious to one skilled in the art that whereas the procedures specified above for fabricating the weakly index-guided inner ridge waveguide, while assuring that only areas outside the inner ridge are ion bombarded, other methods and procedures may be applied to fabricating a structure meeting these requirements.

Figure 2D:
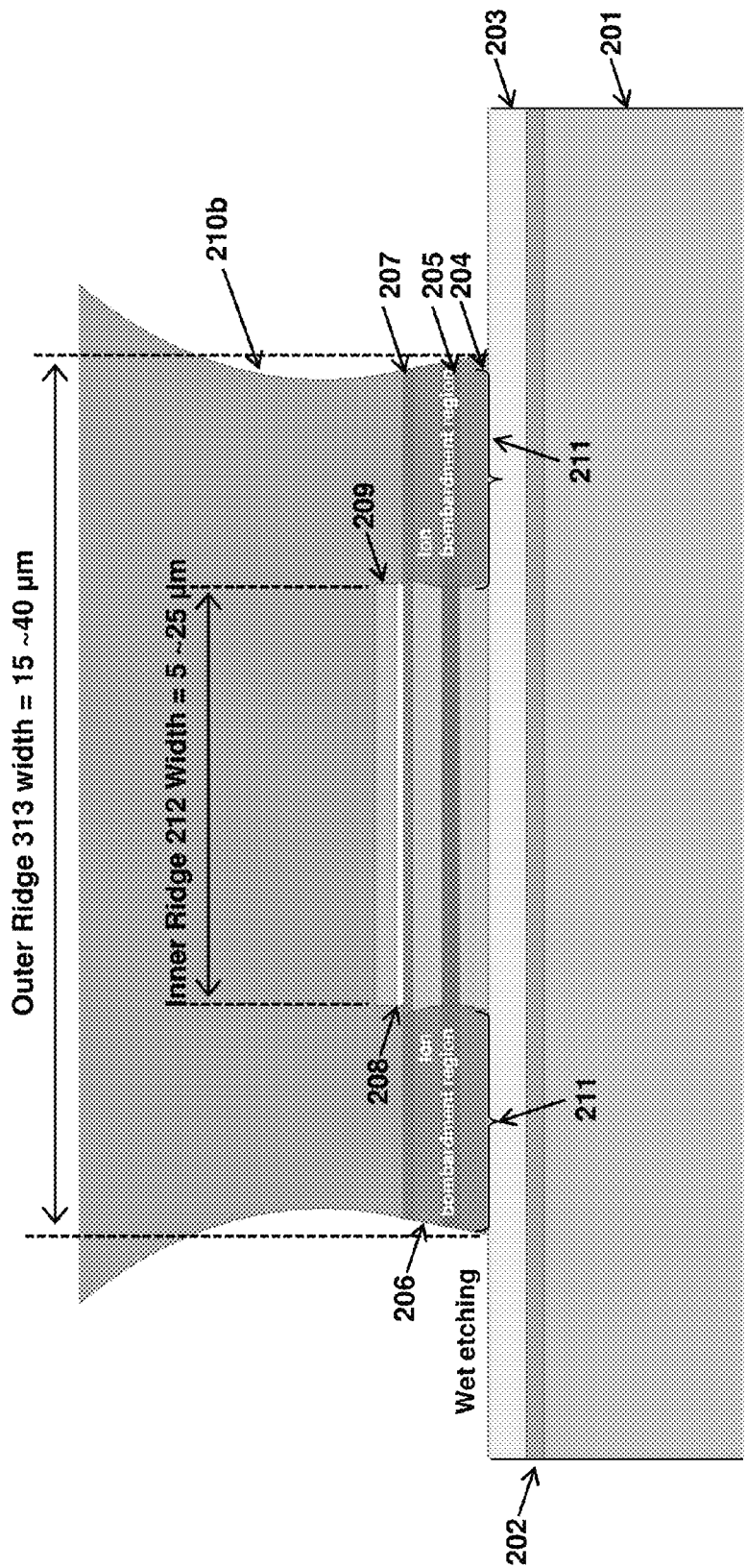

In a next optional step, aspects of which are shown in FIG. 2D, a second layer 210b of photoresist is deposited and patterned to define an outer ridge 213 that is etched to a depth below the active gain stages. The lateral dimensions of this second photoresist layer 210b are preferably wide enough to assure that substantial current does not flow laterally to the boundaries of the outer ridge, and also wide enough to provide space for the electrical contacts that will be placed on one or both sides of the inner ridge. Wet etching may be employed at this step, since the optical mode is confined to the much narrower inner ridge so the etch profile is insignificant. In some embodiments of the invention, outer ridge 213 may be arbitrarily wide (e.g., >50 μm) without impacting the laser operation. In other embodiments, no outer ridge is etched at all, since the lasing mode does not extend far beyond the inner ridge, and the ion bombardment of areas outside the inner ridge will strongly suppresses vertical current leakage in those areas. In what follows, we will refer to the weakly index-guided central ridge that is not ion-bombarded as the inner ridge, even if no outer ridge is present in the particular embodiment.

Once so constructed, this epitaxial layer structure can then be further processed in one of two ways, described below as "Option A" and "Option B," to provide an ICL without a grown top cladding layer in accordance with the present invention.

Option A

As described in more detail below, in embodiments following Option A, a thick dielectric layer may serve as all or part of the top optical cladding layer for the ICL.

Figure 3A:
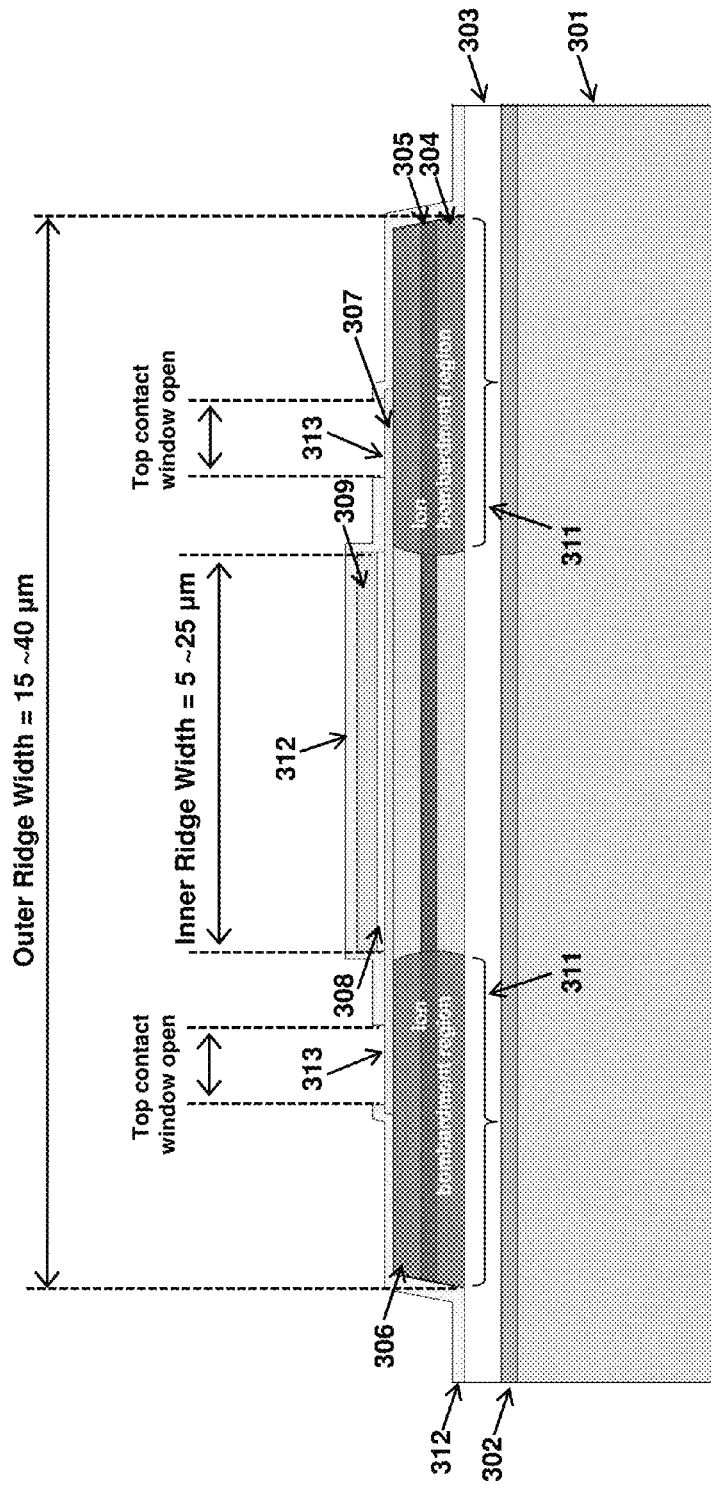
FIGS. 3A-3C are block schematics illustrating aspects of an exemplary embodiment of a narrow ridge waveguide ICL having no grown top cladding layer in accordance with the present invention.
Figure 3B:
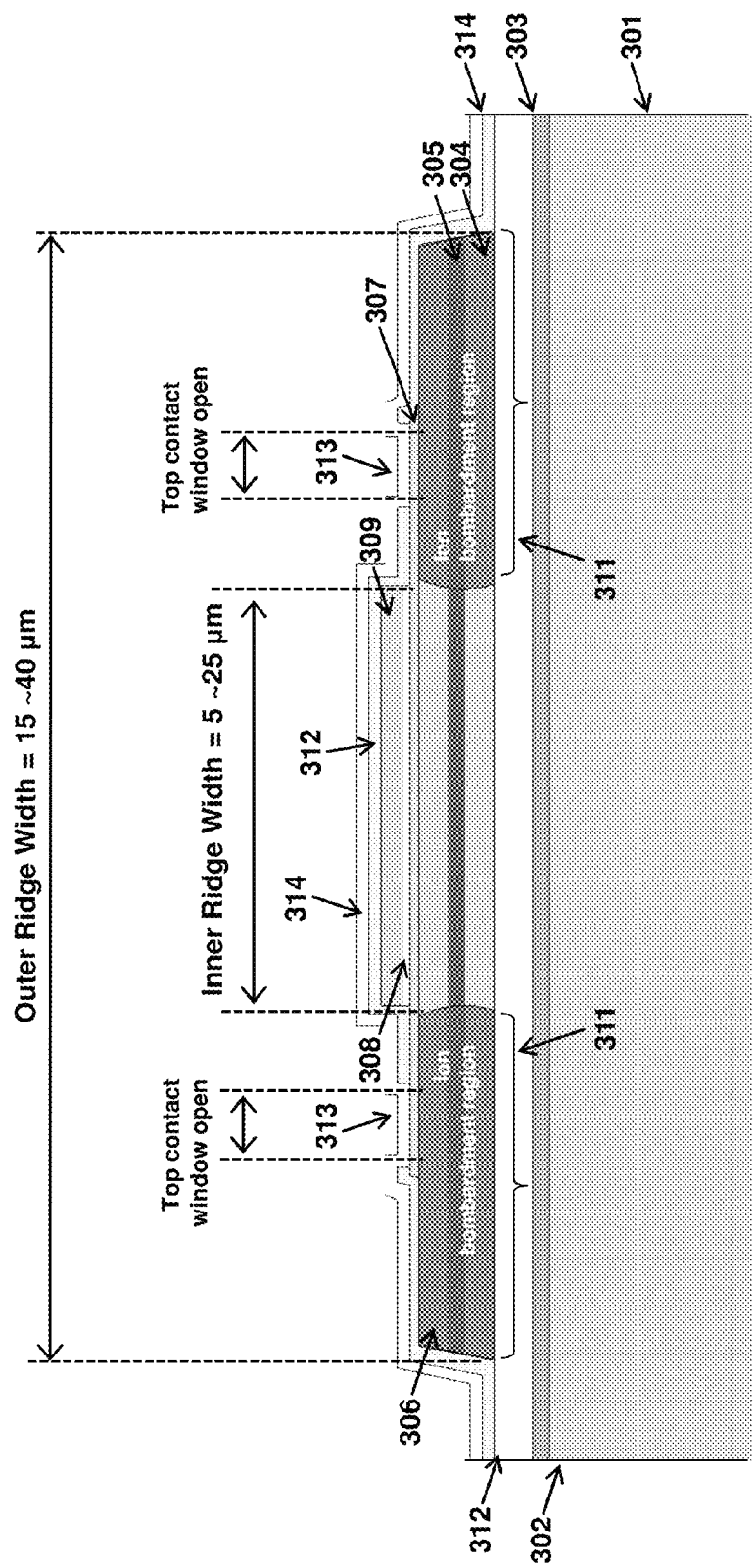

FIGS. 3A and 3B illustrate aspects of an ICL without a grown top cladding layer formed in accordance with Option A. An exemplary ICL fabricated in accordance with Option A will include a ridge waveguide such as that described above with respect to FIG. 2A, i.e., comprising a GaSb substrate 301, an optional GaSb buffer layer 302, an InAs/AlSb superlattice bottom optical cladding layer 303, an optional n$^-$-GaSb bottom separate confinement layer (SCL) 304, an active core 305 comprising three (3) to fifteen (15) interband cascade gain stages, an optional n$^-$-GaSb top SCL 306, an n$^+$-GaSb or n$^+$-InAs(Sb) top contact layer 307, an optional undoped AlAs$_{0.08}$Sb$_{0.92}$ (lattice matched to GaSb) etch-stop layer 308, and finally an n$^-$-GaSb index-guiding layer 309.

It should be noted that various modifications of the exemplary structure illustrated in FIGS. 3A and 3B and materials described herein will be obvious to one skilled in the art. For example, in some embodiments, the ICL structure can be grown on an InAs substrate rather than GaSb; in other embodiments, a thin top cladding layer may be grown in between the top SCL layer 306 and top contact layer 307, and in such embodiments, the grown thin layer may serve as part of the top cladding layer for the ICL. All such variations in materials and structure are deemed to be within the scope of the present invention.

As described above with regard to FIGS. 2A and 2B, a thick photoresist is patterned to define the width of the inner ridge and the regions outside of that ridge which are to be ion bombarded. Following ion bombardment and shallow etching of the inner ridge, a dielectric layer 312 that has a refractive index lower than the lasing modal index and also a low optical loss is deposited on top of the entire upper surface of the structure. In some embodiments, the dielectric material is SiN, although any suitable dielectric may be used. Dielectric layer 312 is then patterned so as to provide electrical insulation everywhere except for the top contact openings 313 on either side of the index-guided inner ridge waveguide.

In accordance with Option A of the present invention, dielectric layer 312 will serve as a top optical cladding layer for the ICL, and so its thickness should be great enough to prevent significant penetration of the lasing mode into the metal layer that will subsequently be deposited on top to provide a pathway for heat dissipation. If SiN is used for the dielectric, this thickness is roughly 500 nm.

As illustrated in FIG. 3B, in embodiments following Option A, the ICL structure further includes top metal layer 314 deposited on an upper surface of dielectric layer 312. One function of top metal layer 314 is to provide for a top electrical contact via the contact openings 313 at the sides of inner ridge. While the metal deposited on the top of the ridge does not contribute to electrical conduction, it provides a pathway for thermal dissipation to reduce heating of the active core. Preferred metals are Cr/Sn/Pt/Au if top contact layer 307 is n$^+$-GaSb or Ti/Pt/Au if top contact layer 307 is n$^+$-InAs or n$^+$-InAs(Sb).

Based on the ion bombardment experiments discussed above, it is important that the metal contact layer be connected to the top of the inner ridge via an uninterrupted pathway within the heavily n-doped top contact layer, since the conduction within the top contact layer is relatively unaffected by the ion bombardment whereas the current flow is significantly suppressed if that layer is removed anywhere along the conduction path. On the other hand, beyond the contact openings, the heavily n-doped top contact layer should be etched away (as illustrated in FIG. 3A and the subsequent figures), since any further outward current flow would only contribute leakage.

Figure 3C:
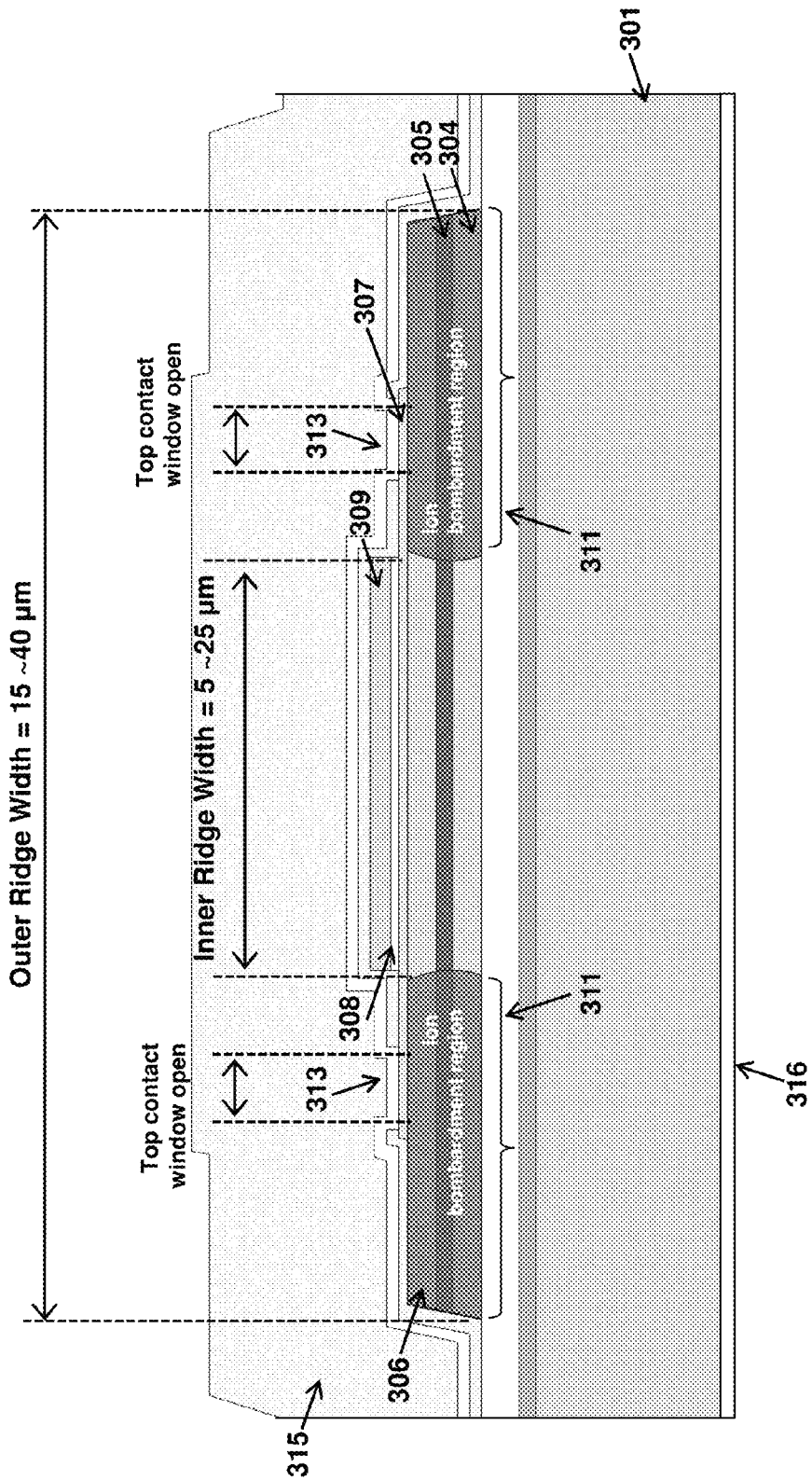

In addition, in many embodiments in accordance with Option A, as illustrated in FIG. 3C, a thick (typically about 5 μm) Au layer 315 is deposited on an upper surface of the entire structure to enhance the dissipation of heat from the structure during operation. Au layer 315 is typically deposited using electro-plating, though other methods for deposition of the Au layer may be used as appropriate. A bottom contact metal 316 such as Cr/Pt/Au is finally deposited on the bottom of the n$^+$-substrate 301.

Once so fabricated, the ridge structure may then be mounted, e.g., on a heat sink, either epitaxial side up or epitaxial side down using any suitable method known in the art. See, e.g., U.S. Pat. No. 8,879,593 "Approach and Method for Epitaxial-Side-Down Mounting of High-Power Semiconductor Lasers with High Yield." (2014).

Option B

As described in more detail below, in embodiments in accordance with Option B, the dielectric is patterned so as to cover only the sidewalls and base of the outer ridge, leaving the inner weakly index-guided ridge waveguide fully exposed, so that air may be used for all or part of the top cladding layer.

Figure 4A:
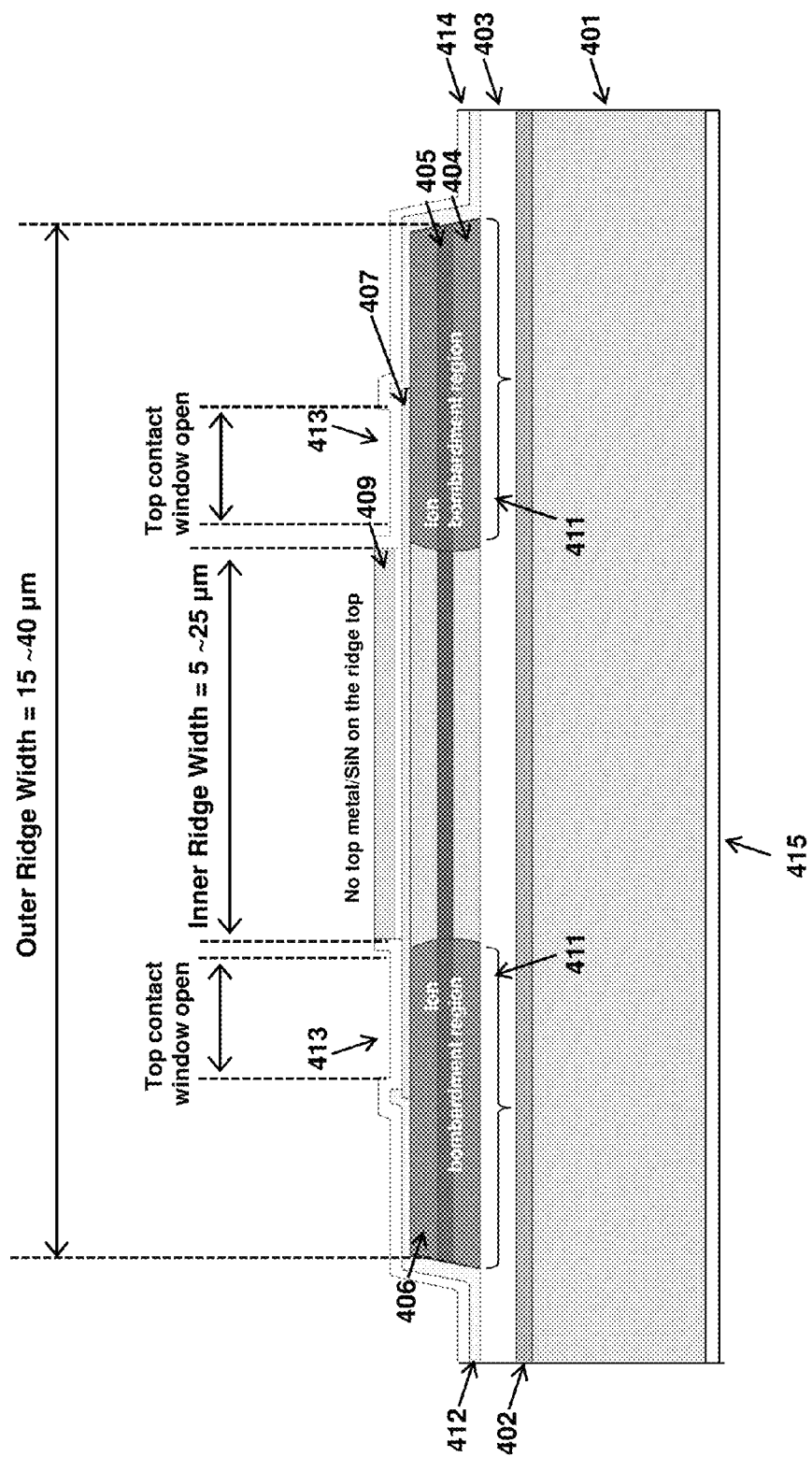
FIGS. 4A and 4B are block schematics illustrating aspects of two other exemplary embodiments of a narrow ridge waveguide ICL having no grown top cladding layer in accordance with the present invention.
Figure 4B:
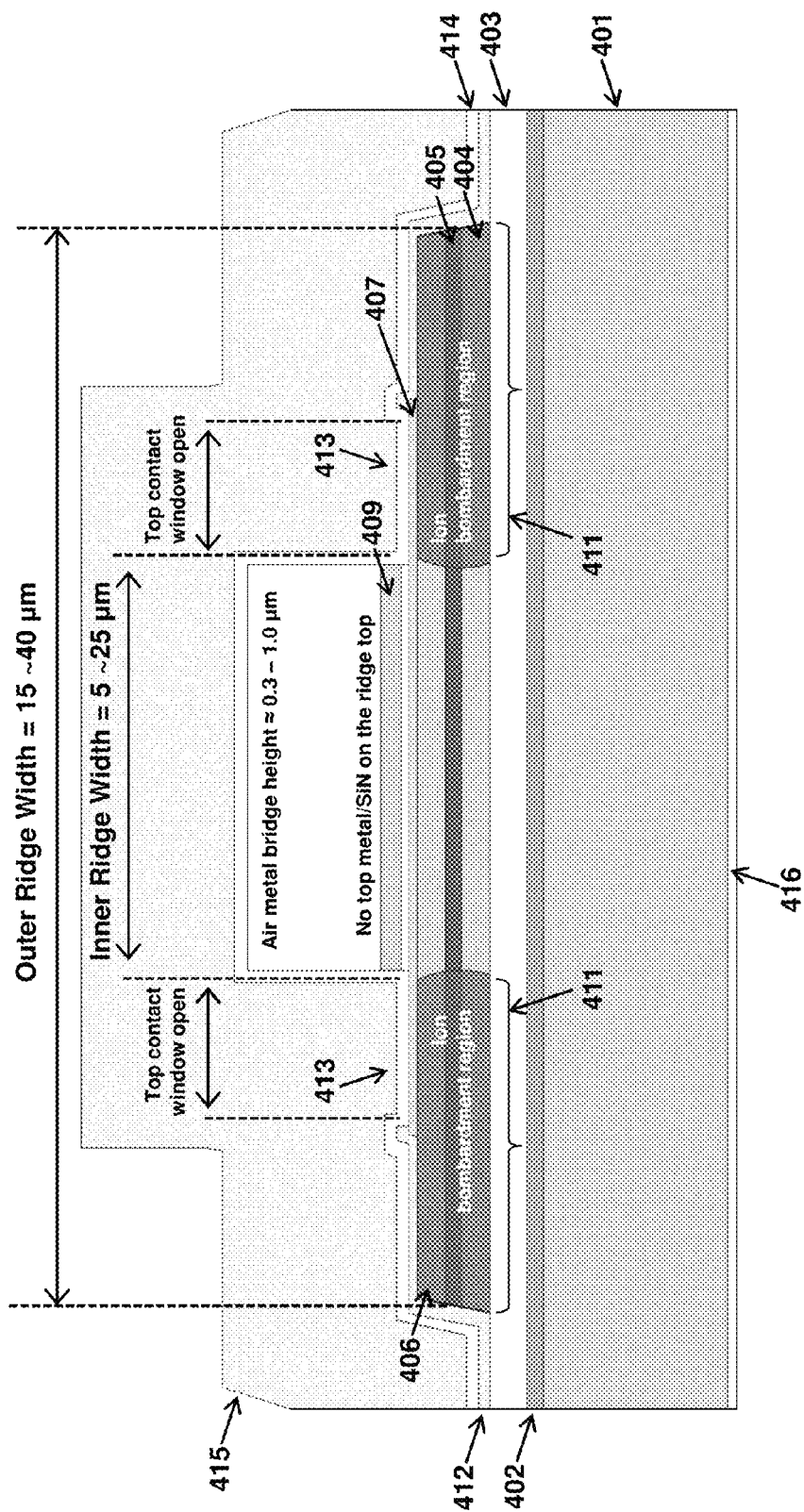

FIGS. 4A and 4B illustrate aspects of an ICL without a grown top cladding layer formed in accordance with Option B.

Thus, as illustrated in FIG. 4A, an ICL without a grown top cladding layer in accordance with Option B includes a ridge waveguide such as that described above with respect to FIG. 2A, i.e., comprising a GaSb substrate 401, a GaSb buffer layer 402, an InAs/AlSb superlattice bottom optical cladding layer 403, an n$^-$-GaSb bottom separate confinement layer (SCL) 404, an active core 405 comprising three (3) to fifteen (15) interband cascade gain stages, an n$^-$-GaSb top SCL 406, an n$^+$-GaSb or n$^+$-InAs(Sb) top contact layer 407, an optional undoped AlAs$_{0.08}$Sb$_{0.92}$ (lattice matched to GaSb) etch-stop layer 408, and finally an n$^-$-GaSb index-guiding layer 409. If the laser is a DFB, a DFB grating can already be etched into GaSb index-guiding layer 409 at an earlier stage of the processing.

As with embodiments following Option A above, various modifications of the exemplary Option B structure illustrated in FIGS. 4A and 4B and materials described herein will be obvious to one skilled in the art. For example, in some embodiments, the ICL structure can be grown on an InAs substrate rather than GaSb; in other embodiments, a thin top cladding layer may be grown in between the top SCL layer 406 and top contact layer 407, and in such embodiments, the grown thin layer may serve as part of the top cladding layer for the ICL.

As in the case of Option A and as described above with regard to FIGS. 2A and 2B, in the embodiment illustrated in FIGS. 4A and 4B, a thick photoresist is patterned to define the width of the inner ridge and the regions outside of that ridge which are to be ion bombarded. Following ion bombardment and shallow etching of the inner ridge, in an ICL in accordance with Option B a layer 412 of a dielectric is deposited on an upper surface of the ridge waveguide. In many embodiments, the dielectric material will be SiN, though any suitable dielectric may be used. In embodiments in accordance with Option B, dielectric layer 412 need only be thick enough to prevent electrical shorting at the sidewalls and base of outer ridge.

While dielectric layer 312 according to Option A is patterned so as to provide electrical insulation everywhere except for top contact openings 313 defined on both sides of the ridge, as illustrated in FIG. 4A, as noted above, in an ICL in accordance with Option B, dielectric layer 412 is patterned so as to cover only the sidewalls and base of outer ridge, leaving the inner index-guided ridge waveguide fully exposed, so that air is used for part or all of the top cladding layer.

A top metal layer 414 is then deposited on an upper surface of the structure. As in Option A, the preferred metals to be used in Option B are Cr/Sn/Pt/Au for contacting $n^+$-GaSb or Ti/Pt/Au for contacting $n^+$-InAs(Sb). As shown in FIG. 4A, photolithography is used to pattern the metal contact layer such that it is removed from the top surface of the inner index-guided ridge to expose the top surface of the upper $n^-$-GaSb index-guiding layer 409.

In many embodiments, the contact metal is left on the bare sidewalls of the inner ridge that defines the weakly index-guided ridge waveguide, so as to provide additional loss that discriminates against higher-order lateral lasing modes whose profiles have greater intensity near the boundaries of the ridge, while favoring the selection of the fundamental mode whose intensity profile is concentrated at the center of the ridge.

As in the case of Option A, a bottom contact metal 416 such as Cr/Pt/Au is deposited on the bottom of the $n^+$-substrate 401. In both Option A and Option B, electrical injection is provided laterally via contact between top metal layer 314/414 and $n^+$-GaSb or $n^+$-InAs(Sb) top contact layer 307/407.

Mounting alternatives are more limited for embodiments based on Option B, since air forms the top cladding layer on top of the bare epitaxial surface. One option is to thin the substrate and then mount the device epitaxial-side up, relying on thermal conduction through the thinned substrate to remove heat. The power-density thresholds for high-quality ICLs are typically low enough that the devices can operate in this fashion in continuous wave (cw) mode at room temperature, although the maximum output power is limited by heating of the active core when currents well above the lasing threshold are injected.

A second mounting approach for embodiments based on Option B is to remove the GaSb substrate so as to significantly shorten the path length for heat removal from the bottom of the device. Processing methods for removing epilayers from GaSb substrates are relatively immature at this time.

A third mounting approach is to provide an "air dome" above the ridge waveguide, and then electro-plate the top of the dome, leaving a layer of air (or vacuum, or some other gas) above the ridge, for subsequent epitaxial side up or epitaxial side down mounting. Aspects of this configuration of the invention are illustrated in FIG. 4B.

In the embodiment illustrated in FIG. 4B, prior to the photolithography for deposition of the top metal layer, a Ge film (not shown) having a thickness of about 0.3 to 1.0 μm and a width the same as that of the index-guided ridge is deposited on top of the ridge waveguide. Top metal layer 414 is then is deposited as described above, followed by an electroplated Au layer 415 having a thickness of about 5 to about 6 μm. Both top metal layer 414 and the electroplated Au layer 415 are patterned to have periodic slots along the ridge to allow access for an application of hydroperoxide to etch away the Ge film. Once the Ge film has been etched away from the top of the index-guided ridge and from underneath the metal, an air dome will remain above the index-guided ridge waveguide. Slots having a typical length of about 5 μm will provide the hydroperoxide etchant access to the air-domed regions that are typically about 20 μm long. The Au electroplating provides thermal dissipation for epitaxial side up mounting, and can also be employed with an epitaxial-side-down mounting such as that described in U.S. Pat. No. 8,879,593 supra. It is believed that this method will prevent solder from flowing into the slots and causing optical loss.

While embodiments employing an air dome do not provide for direct thermal conduction from the top of the inner index-guided ridge waveguide to the top contact metal and electro-plated gold, the lateral flow of heat from the active core to the ion-bombarded regions at the sides and thence to the top metal layer will nonetheless provide more efficient heat removal than the pathway via the substrate in the absence of the air dome.

A further alternative is to form the central ridge for weak index guiding by depositing and patterning a dielectric on top of the grown semiconductor epilayer rather than by etching the epilayer itself. One attractive choice for the dielectric is germanium (Ge) due to its high refractive index that is higher than that of the active core, although other materials such as Si may also be employed as appropriate. Following deposition of the Ge, a DFB grating may be formed by etching or lift-off of the Ge layer. This approach may be used to form a grating of depth up to at least 300-400 nm to provide a grating with very high coupling coefficient Examples of embodiments following this approach are illustrated in FIGS. 5A and 5B.

Figure 5A:
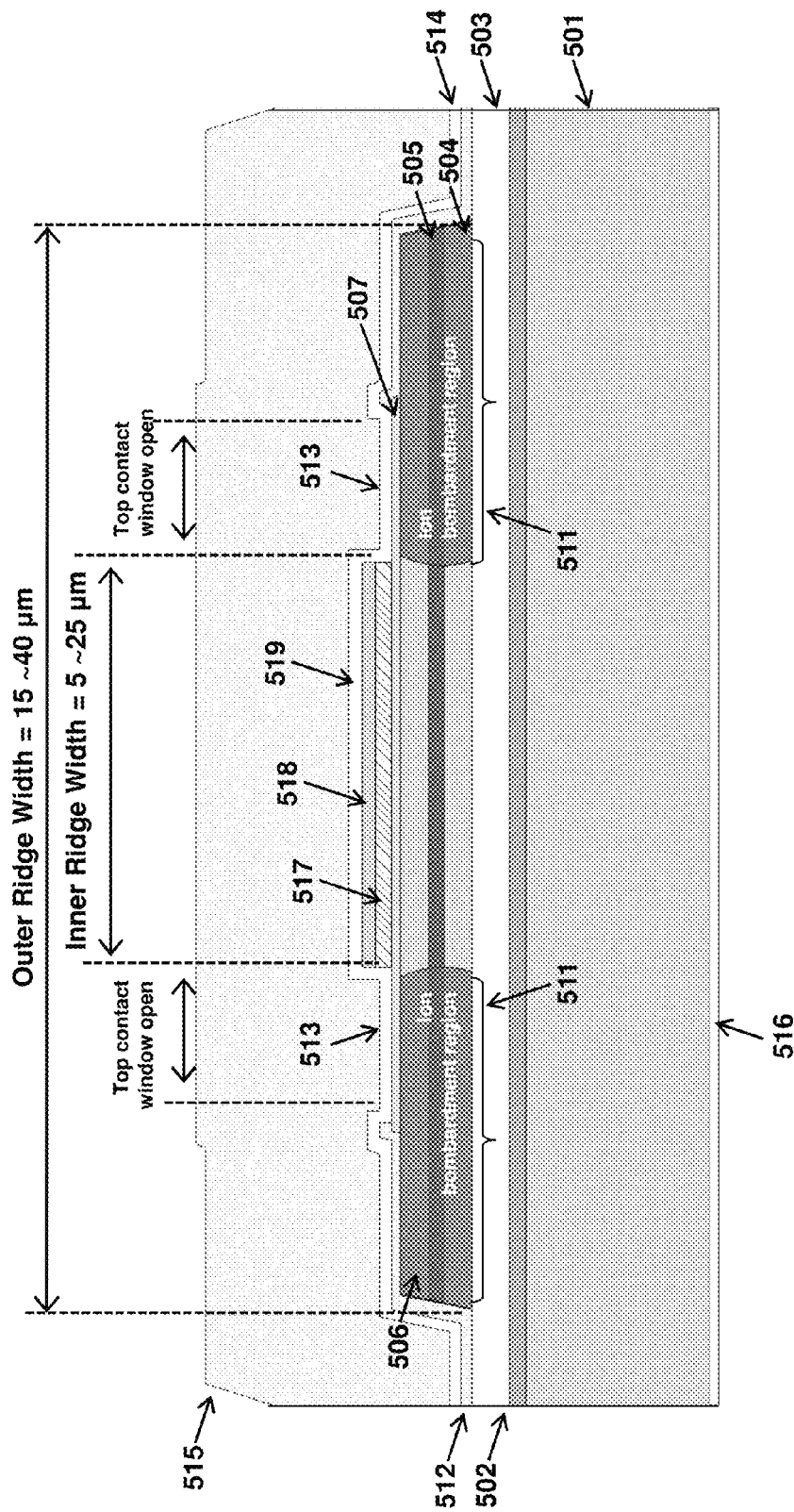
FIGS. 5A and 5B are block schematics illustrating aspects of further exemplary embodiments of narrow ridge waveguide ICLs having no grown top cladding layer in accordance with the present invention.
Figure 5B:
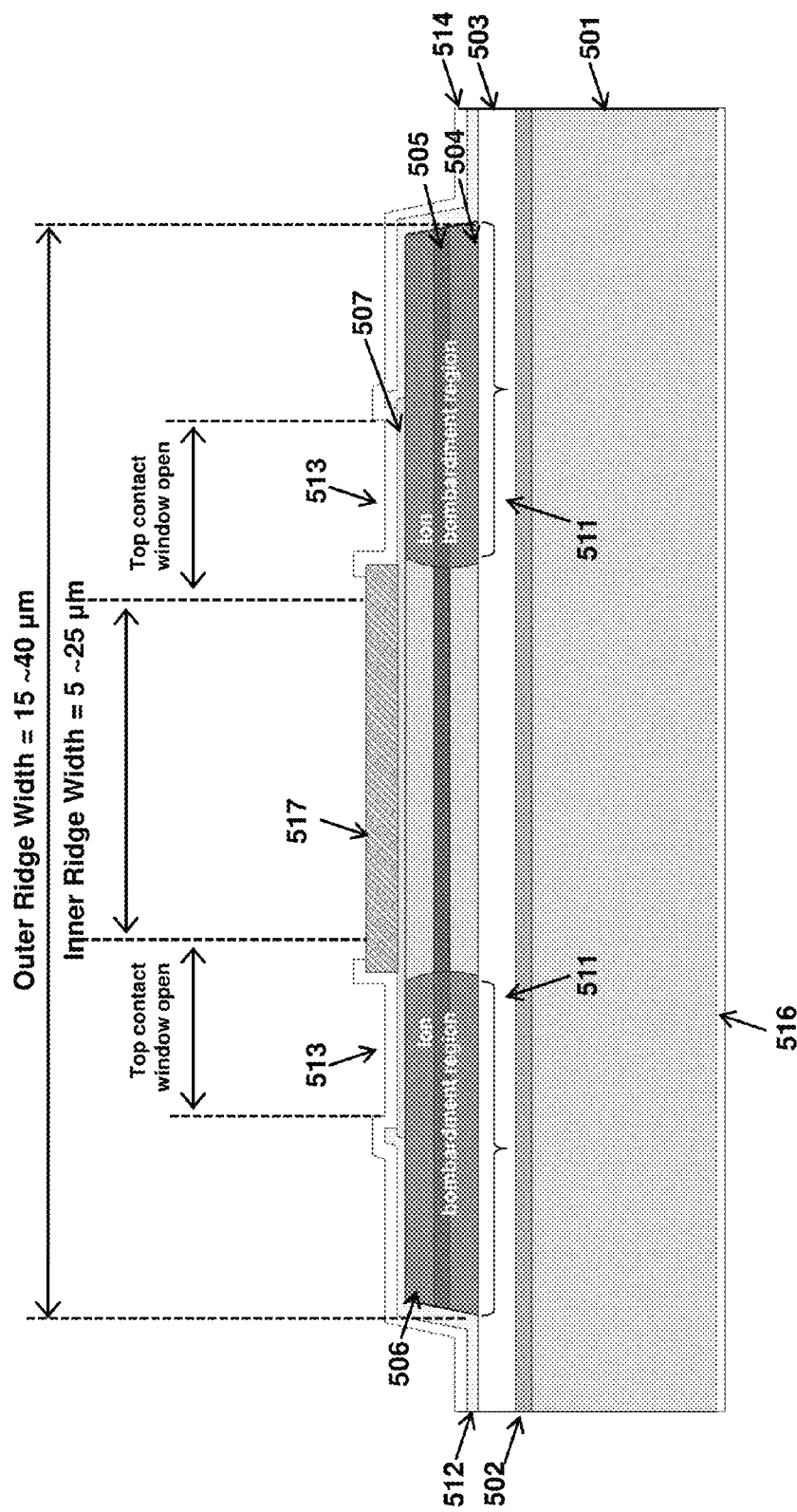

In the embodiment illustrated in FIGS. 5A and 5B, Ge layer 517 is deposited on top of the laser ridge comprising elements 501-507 corresponding to elements 301-307 described above with respect to FIGS. 3A and 3B. In some embodiments, Ge layer 517 may optionally be patterned with a DFB grating as described above to provide a high coupling coefficient.

In some embodiments such as that illustrated in FIG. 5A, an insulating dielectric layer 512 of, e.g., SiN, can be deposited between Ge layer 517 and top metal layer 514. In such cases, as described above with respect to Option A, the dielectric layer serves as all of the top cladding layer if there is no grown top cladding layer or part of the top cladding layer if an additional thin layer having a refractive index less than that of the active core is grown between the top SCL layer 506 and top contact layer 507.

In other embodiments, such as the one illustrated in FIG. 5B, Ge layer 517 can be left bare, with the air serving as all of the top cladding layer as described above with respect to Option B if there is no grown top cladding layer or part of the top cladding layer if an additional thin layer is grown between the top SCL layer 506 and top contact layer 507.

In all such embodiments, an $n^+$-InAs(Sb) or other heavily n-doped top contact layer 507 is grown on top of the structure. As in the case of Option A, it is important that the structure provides an uninterrupted pathway within the heavily n-doped top contact layer to connect the metal contacts to the top of the inner ridge, since ion bombardment can significantly increase the impedance if that layer is removed anywhere along the conduction path.

Finally, in the embodiment illustrated in FIG. 5A, an optional Au electroplate layer 515 can be deposited over the top, sides, and base of the ridge to improve thermal management, whereas in the embodiment illustrated in FIG. 5B, an air dome can be formed as described above with respect to FIG. 4B. In both cases, as with the other embodiments in accordance with Option B, the devices depicted in FIGS. 5A and 5B may be mounted either epitaxial-side-up or epitaxial-side-down as appropriate.

Advantages and New Features:

The present invention provides the first practical and efficient means for realizing weakly index-guided interband cascade laser ridges without allowing appreciable vertical current flow in regions outside the ridge boundaries. All previous weakly index-guided ICLs have suffered from higher threshold current densities and lower power conversion efficiencies due to the substantial lateral current spreading that occurs when an ICL ridge is not etched to a depth below the active gain stages. See, e.g., S. Forouhar, C. Borgentun, C. Frez, R. M. Briggs, M. Bagheri, C. L. Canedy, C. S. Kim, M. Kim, W. W. Bewley, C. D. Merritt, J. Abell, I. Vurgaftman, and J. R. Meyer, "Reliable Mid-Infrared Laterally-Coupled Distributed-Feedback Interband Cascade Lasers," *Appl. Phys. Lett.* 105, 051110 (2014). Because the invention allows the etch through the active gain stages to occur at the boundaries of an outer ridge that may be placed 10-100 µm (or more) from the inner index-guide ridge waveguide, the processing yield should improve since at that remote position an isotropic wet etch that produces highly non-vertical angled sidewalls, but avoids the sidewall leakage that can result from damage induced by dry etching, will be acceptable in most packaging architectures.

The efficient lateral current injection of the present invention allows a DFB grating having a high coupling coefficient relative to the lasing mode to be patterned on top of the weakly index-guided ridge waveguide without increasing the loss that is normally associated with mode penetration into a top contact metal. Higher losses have caused all previous DFB ICLs with gratings on top of the ridge to be much less efficient and produce far less power than non-DFB ICLs with similar ridge widths. Furthermore, the robustness of the single-mode operation has often been marginal due to weak grating coupling associated with a top cladding layer that must be thick enough to minimize losses, or by positioning the grating at the sides rather than on top of the ridge. These issues are especially challenging for ICLs and other GaSb-based lasers because no reliable overgrowth technology currently exists.

The difficulty is readily circumvented in InP- and GaAs-based semiconductor lasers by overgrowing an electrically-conducting lower-index optical cladding and top contact layer after a DFB grating that couples strongly to the lasing mode is patterned into the epitaxial layer. Using that approach, it is relatively straightforward to fabricate InP- and GaAs-based DFB lasers that combine strong coupling to the grating, low loss, and uncompromised electrical conduction via a metal contact having negligible overlap with the lasing mode.

The present invention's employment of a dielectric (as in embodiments following Option A of the present invention) or air (as in embodiments following Option B) top cladding layer will make it possible to substantially increase the coupling to the DFB grating without inducing any penalty in optical loss. In the complete absence of a semiconductor top optical cladding layer, the grating can be etched as deeply as necessary into the top $n^-$-GaSb index-guiding layer without incurring the additional loss that occurs in a conventional DFB ICL when the contact metal is deposited directly on top of the grating. Optimization of the grating coupling strength can then be guided entirely by consideration of the DFB mode properties and other laser performance characteristics, rather than by a trade-off between marginal coupling strength and excessive optical loss. One consequence is that the grating coupling will be strong enough to ensure robust single-mode output from DFB ICLs with gratings of higher order. This will simplify processing by allowing optical rather than e-beam lithography to be employed.

The present invention has the further advantage of substantially enhancing the flexibly for redistribution of the optical mode profile. If the loss at the top of the structure decreases when an air (Option B) or suitable dielectric such as SiN (Option A) top clad is employed, the mode profile can be redistributed for greater intensity in the upper portion of the waveguide and reduced intensity in the lower portion. The optical loss in SiN at mid-IR wavelengths is known to depend on the deposition quality, although the lower limit remains uncertain. One option provided by such a redistribution is to remove the mode almost entirely from the bottom optical cladding layer whose material loss is non-negligible. If the loss in the GaSb SCLs with low net n-doping level is also minimized, nearly all of the remaining loss may occur in the active gain stages, plus a smaller contribution originating in the thin InAs/AlSb transition superlattices that connect the various regions of the device. Because the loss in the active gain stages is proportional to the optical confinement factor, which in turn scales roughly with the number of stages, it may become possible to reduce the stage multiplicity to 2 or 3, thereby substantially reducing the bias voltage and net drive power required to reach the lasing threshold.

Furthermore, whereas ICLs generally exhibit an increasing threshold current density and decreasing slope efficiency at wavelengths beyond 4 µm, by substantially minimizing the optical losses associated with the entire upper portion of the structure, and also with the bottom optical cladding layer when the mode is redistributed as discussed above, the invention provides an effective means for significantly lowering the net loss at longer wavelengths. A related advantage is that because no top optical cladding layer or a thinner top cladding layer is required, the MBE growth time and net epitaxial thickness, which scale almost linearly with wavelength and can become excessive when conventional ICLs are grown, are substantially reduced. For spectroscopy and other applications in which low drive power is a critical performance metric, we expect these new advantages to make ICLs designed and processed according to the invention to remain advantageous over quantum cascade lasers at wavelengths extending well beyond the current limit of ≈6 µm.

Besides reducing the threshold power required to drive a narrow-ridge ICL, whether or not a DFB grating is employed to produce output in a single spectral mode, the invention's reduction of optical loss will enhance the maximum wallplug efficiency and output power attainable from ICLs. These advantages will provide both higher output power in a single spectral mode and higher power and brightness generated by narrow-ridge ICLs without DFB gratings.

A further advantage of Option A is that the dielectric top cladding layer such as SiN may have higher thermal conductivity than the InAs/AlSb short-period superlattice top cladding layer that is employed in conventional ICL designs. Therefore, the net thermal resistance will be reduced, and less heating of the active core will occur under given operating conditions.

An advantage of the embodiments illustrated in FIGS. 5A and 5B, which form the index-guided ridge by depositing and patterning a Ge or some other dielectric layer on top of the epilayer, is that they require no etching of the semiconductor.

Alternatives:

Numerous alternatives falling within the scope of the invention will be obvious to one skilled in the art. For example, the ICL gain stages may employ radiative transitions in either type-II or type-I active quantum wells, the substrate may be either GaSb or InAs, and the compositions and thicknesses of the various optical cladding layers, SCLs, active quantum well and injector compositions, transition superlattices, contacting layer, and top GaSb index-guiding layer may employ numerous variations besides those of the exemplary structures discussed above. A wide range of ion bombardment conditions may also be suitable for strongly suppressing the gain and vertical conduction through the active gain stages while providing a pathway for lateral current injection at the top of the epi-layer.

Either epitaxial side up or epitaxial side down mounting may be employed. In the former case, the power density threshold for an ICL is generally low enough that heat dissipation via the substrate is sufficient to allow the devices to be operated in cw mode at room temperature. While thermal rollover will occur above threshold due to heating of the active gain stages, this can be minimized by removing the substrate or providing a means to enhance the lateral flow of heat. Conventional methods known to the art can be used to mount the structures with a dielectric top surface (Option A) in an epitaxial side down configuration. In this case it is beneficial in preferred embodiments to deposit a metal on the top surface of the ridge, and then electro-plate a relatively thick layer of gold (≈5 µm thick) on top of the entire device structure prior to the epitaxial side down mounting. Devices employing Option B, in which no dielectric is deposited on top of the exposed n⁻-GaSb top index-guiding layer or other top epilayer, may be mounted epitaxial side down following processing of the domed structure discussed above.

Since no electrical conduction is required and the refractive index need only be lower than the modal index, the top dielectric layer may be chosen from a wide variety of material choices. Besides SiN, these include $Al_2O_3$ or Si if the modal index is sufficiently low. The choice may be guided by consideration of the minimum optical loss and also convenience and economy of the dielectric deposition and subsequent processing.

By providing an effective means for implementing gain guided ICL ridges without current spreading, the invention will increase the maximum ridge width for which lasing in a single lateral mode can be maintained, or for which a relatively good beam with low $M^2$ can be maintained (even the output is not in a single lateral mode). This will be advantageous in applications requiring high maximum output power and brightness. The maximum ridge width for which a good beam (or single lateral mode) is maintained can be increased further by patterning corrugations into the sidewalls of the inner index-guided ridge, as has been demonstrated previously for conventional narrow-ridge ICLs. See C. S. Kim, M. Kim, J. R. Lindle, W. W. Bewley, C. L. Canedy, J. Abell, I. Vurgaftman, and J. R. Meyer, "Corrugated-Sidewall Interband Cascade Lasers with Single-Mode Midwave-Infrared Emission at Room Temperature," *Appl. Phys. Lett.* 95, 231103 (2009).

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A weakly index-guided narrow ridge interband cascade laser (ICL) having no grown top cladding layer or a thin grown top cladding layer, comprising:
   a semiconductor chip comprising:
      a GaSb or InAs substrate;
      an active core comprising 3 to 15 ICL gain stages;
      a bottom optical cladding layer disposed between the substrate and the active core, the bottom optical cladding layer having a refractive index lower than a refractive index of the active core;
      a top optical cladding layer disposed on top of the active core, the top optical cladding layer having a thickness of 0-500 nm and having a refractive index lower than the refractive index of the active core;
      a thin heavily n-doped top contact layer disposed on the top optical cladding layer; and
      a top index-guiding layer disposed on the heavily n-doped top contact layer, the top index guiding layer having a refractive index higher than the refractive index of the active core;
   an inner ridge formed on a portion of the semiconductor chip,
      the inner ridge being defined by a patterned area on the semiconductor chip and by removal of the top index-guiding layer to expose the heavily n-doped contact layer in areas of the semiconductor chip outside the inner ridge;
   a dielectric layer deposited on top of the semiconductor chip and on the top and sides of the inner ridge,
      the dielectric layer being patterned to form contact openings in the semiconductor chip on at least one side of the inner ridge; and
   a metal layer deposited on the patterned dielectric,
      the metal layer forming top electrical contacts to the top contact layer, the metal layer and the top contact layer forming an uninterrupted electrical connection between the top electrical contacts and the inner ridge;

wherein the dielectric layer comprises at least a part of an index-guiding top cladding layer of the ICL; and wherein the ICL further includes an ion bombardment region along the semiconductor chip on both sides of the inner ridge, the ICL being ion-bombarded at an ion energy and dose sufficient to strongly suppress a vertical flow of current in the ion bombardment region, the ion bombardment region extending laterally on both sides of the inner ridge at least to a distance of current spreading in the bombarded material.

2. The ICL according to claim 1,
further comprising a bottom GaSb or InAs separate confinement layer (SCL) disposed between the bottom optical cladding layer and the active core.

3. The ICL according to claim 1,
further comprising a top InAs or GaSb separate confinement layer (SCL) disposed between the active core and the top contact layer.

4. The ICL according to claim 1,
further comprising a thin top cladding layer disposed between the active core and the top contact layer;
wherein the thin top cladding layer forms at least a part of the top cladding layer of the ICL.

5. The ICL according to claim 1, wherein the inner ridge has a width of about 5-25 μm.

6. The ICL according to claim 1, wherein the dielectric layer comprises a SiN layer having a thickness of about 500 nm.

7. The ICL according to claim 1, wherein the top index-guiding layer comprises a Ge layer deposited on an upper surface of the dielectric layer on the inner ridge.

8. The ICL according to claim 1, wherein the top index-guiding layer comprises an $n^-$-GaSb layer deposited on an upper surface of the dielectric layer on the inner ridge.

9. The ICL according to claim 1, wherein the top index-guiding layer is patterned with a distributed feedback (DFB) grating.

10. The ICL according to claim 1, wherein the top contact layer comprises $n^+$-GaSb and the metal layer comprises one or more of Cr, Sn, Pt, and Au.

11. The ICL according to claim 1, wherein the top contact layer comprises $n^+$-InAs or $n^+$-InAs(Sb) and the metal layer comprises one or more of Ti, Pt, and Au.

12. The ICL according to claim 1, wherein the ICL is mounted epitaxial-side-up.

13. The ICL according to claim 1, wherein the ICL is mounted epitaxial-side-down.

14. A weakly index-guided narrow ridge interband cascade laser (ICL) having no grown top cladding layer or a thin grown top cladding layer, comprising:
a semiconductor chip comprising:
 a GaSb or InAs substrate;
 an active core comprising 3 to 15 ICL gain stages;
 a bottom optical cladding layer disposed between the substrate and the active core, the bottom optical cladding layer having a refractive index lower than a refractive index of the active core;
 a top optical cladding layer disposed on top of the active core, the top optical cladding layer having a thickness of 0-500 nm and having a refractive index lower than the refractive index of the active core;
 a thin heavily n-doped top contact layer disposed on the top optical cladding layer; and
 a top index-guiding layer disposed on the heavily n-doped top contact layer, the top index guiding layer having a refractive index higher than the refractive index of the active core;
an inner ridge formed on a portion of the semiconductor chip,
 the inner ridge being defined by a patterned area on the semiconductor chip and by removal of the top index-guiding layer to expose the heavily n-doped contact layer in areas of the semiconductor chip outside the inner ridge;
a dielectric layer deposited on top of the semiconductor chip and patterned such that the dielectric layer covers the sides only of the inner ridge such that the top of the inner ridge is exposed to air,
 the dielectric layer being patterned to form contact openings in the semiconductor chip on at least one side of the inner ridge; and
a metal layer deposited on the patterned dielectric,
 the metal layer forming top electrical contacts to the top contact layer, the metal layer and the top contact layer forming an uninterrupted electrical connection between the top electrical contacts and the inner ridge;
wherein the air comprises at least a part of a top cladding layer of the ICL; and
wherein the ICL further includes an ion bombardment region along the semiconductor chip on both sides of the inner ridge, the ICL being ion-bombarded at an ion energy and dose sufficient to strongly suppress a vertical flow of current in the ion bombardment region, the ion bombardment region extending laterally on both sides of the inner ridge at least to a distance of current spreading in the bombarded material.

15. The ICL according to claim 14,
further comprising a bottom GaSb or InAs separate confinement layer (SCL) disposed between the bottom optical cladding layer and the active core.

16. The ICL according to claim 14,
further comprising a top InAs or GaSb SCL disposed between the active core and the top contact layer.

17. The ICL according to claim 14,
further comprising a thin top cladding layer disposed between the active core and the top contact layer;
wherein the thin top cladding layer forms at least a part of the top cladding layer of the ICL.

18. The ICL according to claim 14, wherein the inner ridge has a width of about 5-25 μm.

19. The ICL according to claim 14, wherein the dielectric layer comprises a SiN layer having a thickness of about 500 nm.

20. The ICL according to claim 14, further comprising an electro-plated Au layer extending across the inner ridge above an upper surface of the top index-guiding layer to form an air bridge across the width of the inner ridge, the air bridge forming an air gap in the Au layer above the inner ridge;
wherein air in the air gap serves as at least part of the index-guiding top cladding layer of the ICL.

21. The ICL according to claim 14, wherein the top index-guiding layer comprises a Ge layer deposited on an upper surface of the dielectric layer on the inner ridge.

22. The ICL according to claim 14, wherein the top index-guiding layer comprises an $n^-$-GaSb layer deposited on an upper surface of the dielectric layer on the inner ridge.

23. The ICL according to claim 14, wherein the top index-guiding layer is patterned with a distributed feedback (DFB) grating.

24. The ICL according to claim 14, wherein the inner ridge further includes an undoped etch stop layer deposited on an upper surface of the top contact layer, the etch stop layer being lattice-matched to the substrate.

25. The ICL according to claim 14, wherein the top contact layer comprises $n^+$-GaSb and the metal layer comprises one or more of Cr, Sn, Pt, and Au.

26. The ICL according to claim 14, wherein the top contact layer comprises $n^+$-InAs or $n^+$-InAs(Sb) and the metal layer comprises one or more of Ti, Pt, and Au.

27. The ICL according to claim 14, wherein the ICL is mounted epitaxial-side-up.

28. The ICL according to claim 14, wherein the ICL is mounted epitaxial-side-down.

\* \* \* \* \*